(12) United States Patent
Davis et al.

(10) Patent No.: US 6,736,148 B2
(45) Date of Patent: May 18, 2004

(54) AUTOMATED SEMICONDUCTOR PROCESSING SYSTEM

(75) Inventors: Jeffry A. Davis, Kalispell, MT (US); Kevin P. Meyer, Kalispell, MT (US); Kert L. Dolechek, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 350 days.

(21) Appl. No.: 09/862,752

(22) Filed: May 22, 2001

(65) Prior Publication Data

US 2001/0022188 A1 Sep. 20, 2001

Related U.S. Application Data

(60) Division of application No. 09/112,259, filed on Jul. 8, 1998, now Pat. No. 6,273,110, which is a continuation-in-part of application No. 08/994,737, filed on Dec. 19, 1997, now Pat. No. 6,447,232, which is a continuation-in-part of application No. 08/851,480, filed on May 5, 1997, now abandoned.

(51) Int. Cl.[7] ................................................. B08B 7/04
(52) U.S. Cl. ........................ 134/25.4; 134/26; 134/32; 134/34; 134/902
(58) Field of Search .......................... 134/10, 18, 25.1, 134/25.4, 26, 32, 34, 133, 137, 142, 902; 34/58, 312, 317, 328; 414/935, 936, 937, 938, 940, 786

(56) References Cited

U.S. PATENT DOCUMENTS

| | | | |
|---|---|---|---|
| 3,727,620 A | 4/1973 | Orr | |
| 4,643,629 A | 2/1987 | Takahashi et al. | |
| 4,643,774 A | 2/1987 | Kishida et al. | |
| 4,701,096 A | 10/1987 | Fisher, Jr. | |
| 4,722,752 A | 2/1988 | Steck | |
| 4,725,182 A | 2/1988 | Sakamoto et al. | |
| 4,736,758 A | 4/1988 | Kusuhara | |
| 4,778,532 A | 10/1988 | McConnell et al. | |
| 4,816,081 A | 3/1989 | Mehta et al. | |
| 4,981,408 A | 1/1991 | Hughes et al. | |
| 5,022,419 A | 6/1991 | Thompson et al. | |
| 5,131,799 A * | 7/1992 | Nishi et al. ............ | 414/416.09 |
| 5,203,445 A * | 4/1993 | Shiraiwa ................. | 198/464.3 |
| 5,301,701 A | 4/1994 | Nafziger | |
| 5,371,950 A | 12/1994 | Schumacher | |
| 5,378,145 A | 1/1995 | Ono et al. | |
| 5,421,905 A | 6/1995 | Ueno et al. | |
| 5,487,398 A | 1/1996 | Ohmi et al. | |
| 5,544,421 A * | 8/1996 | Thompson et al. ............ | 34/58 |
| 5,556,479 A | 9/1996 | Bran | |
| 5,603,777 A | 2/1997 | Ohashi | |
| 5,653,045 A | 8/1997 | Ferrell | |
| 5,656,097 A | 8/1997 | Olesen et al. | |
| 5,664,337 A * | 9/1997 | Davis et al. .................... | 34/58 |
| 5,672,212 A | 9/1997 | Manos | |
| 5,740,053 A | 4/1998 | Iwama | |
| 5,807,439 A | 9/1998 | Akatsu et al. | |
| 5,932,027 A | 8/1999 | Mohindra et al. | |
| 5,947,675 A | 9/1999 | Matsushima | |
| 6,009,890 A | 1/2000 | Kaneko et al. | |
| 6,179,930 B1 | 1/2001 | Ide et al. | |
| 6,273,110 B1 * | 8/2001 | Davis et al. ................ | 134/133 |
| 6,279,724 B1 * | 8/2001 | Davis ....................... | 198/465.2 |

* cited by examiner

*Primary Examiner*—Alexander Markoff
(74) *Attorney, Agent, or Firm*—Perkins Coie LLP

(57) ABSTRACT

An automated semiconductor processing system has an indexer bay perpendicularly aligned with a process bay within a clean air enclosure. An indexer in the indexer bay provides stocking or storage for work in progress semiconductor wafers. Process chambers are located in the process bay. A process robot moves between the indexer bay and process bay to carry semi-conductor wafers to and from the process chambers. The process robot has a robot arm vertically moveable along a lift rail. Semiconductor wafers are carried offset from the robot arm, to better avoid contamination. The automated system is compact and requires less clean room floor space.

34 Claims, 23 Drawing Sheets

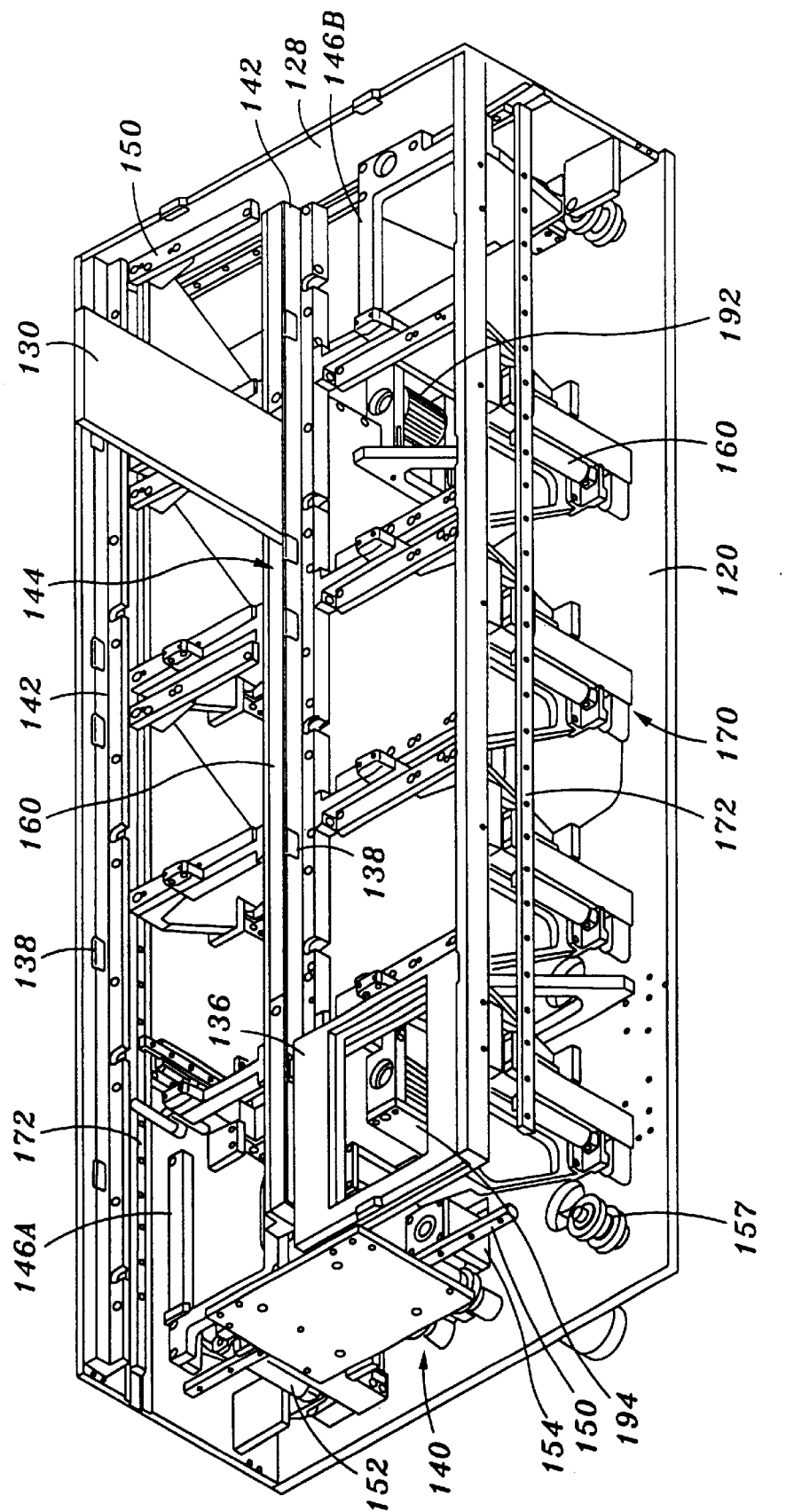

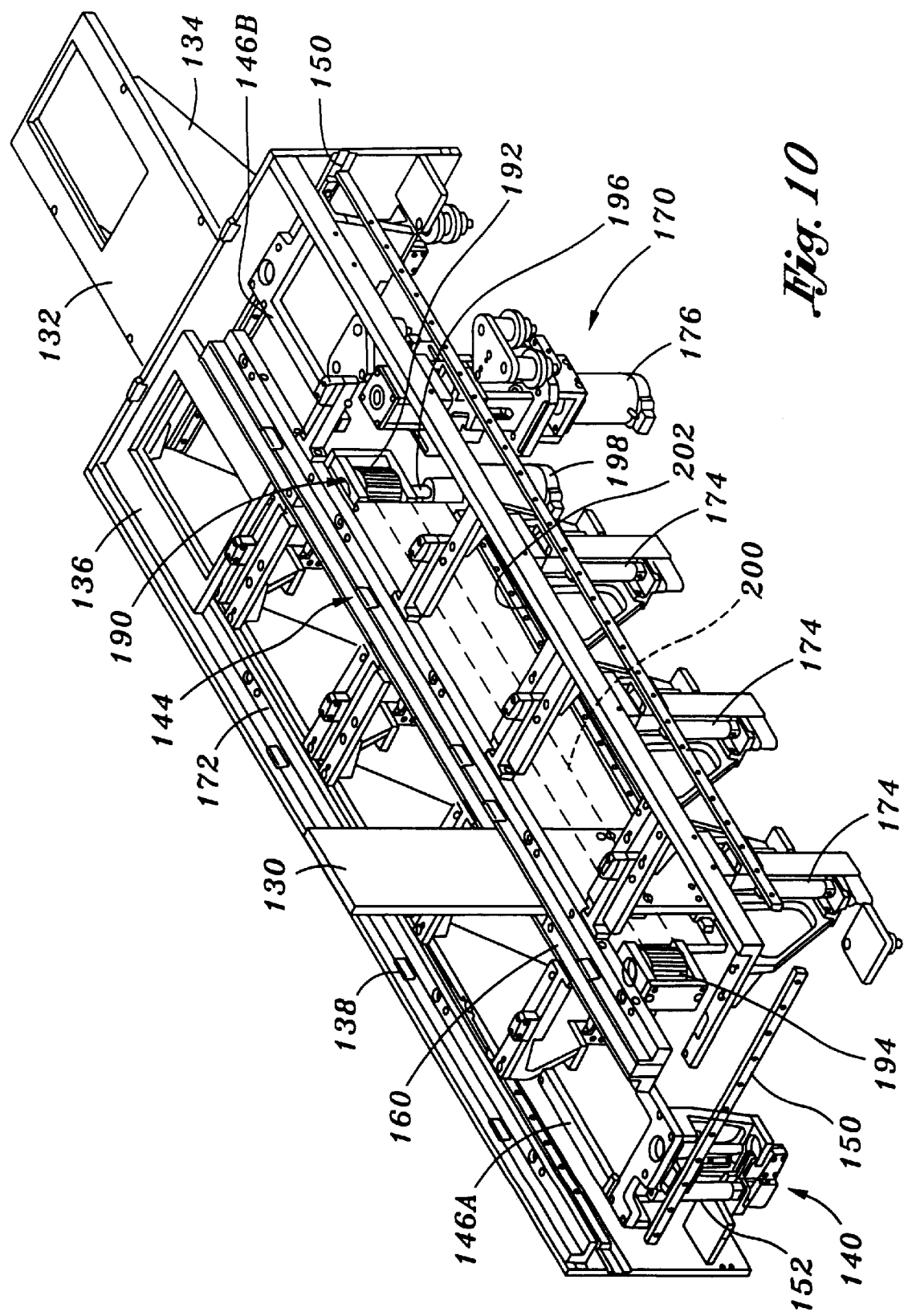

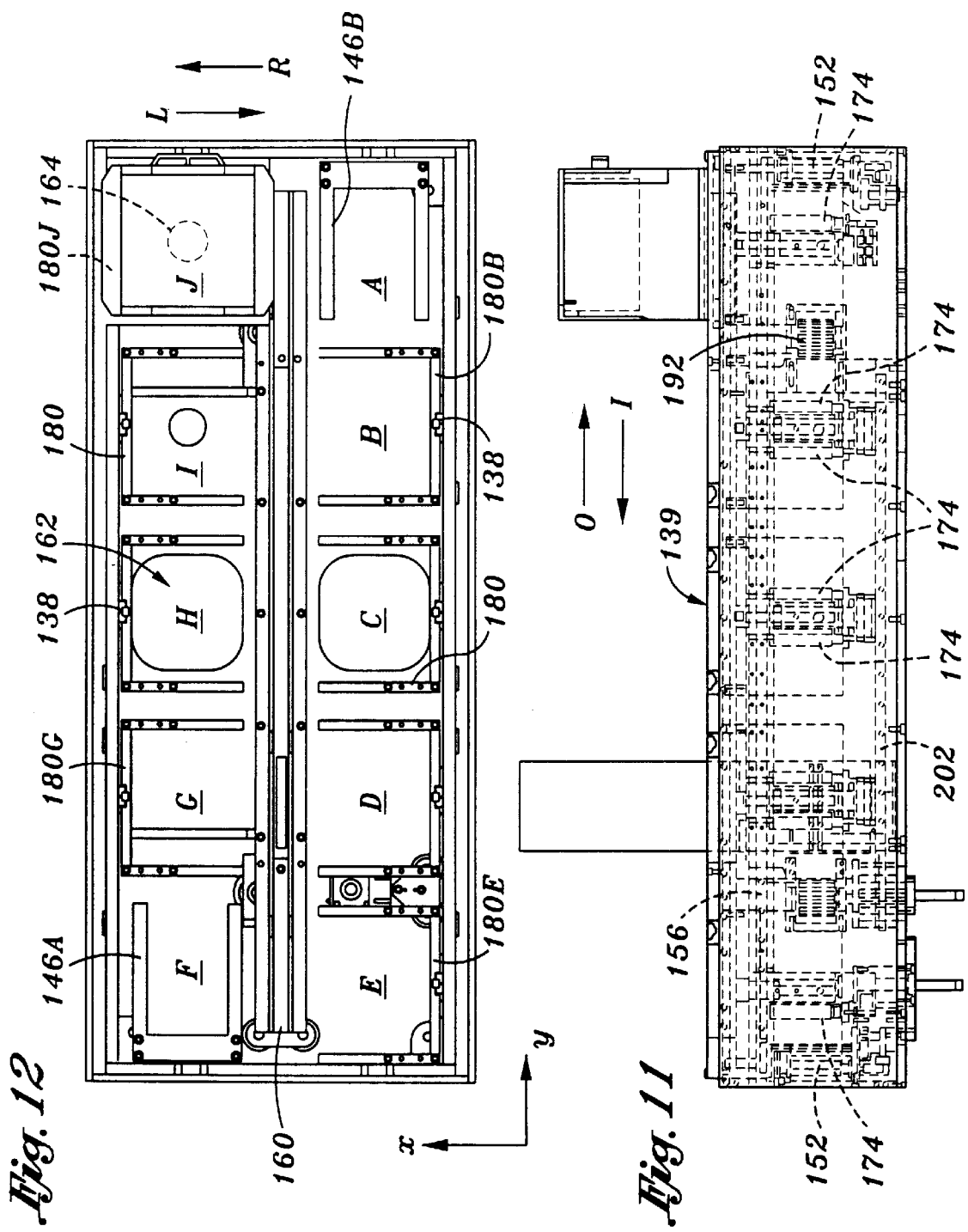

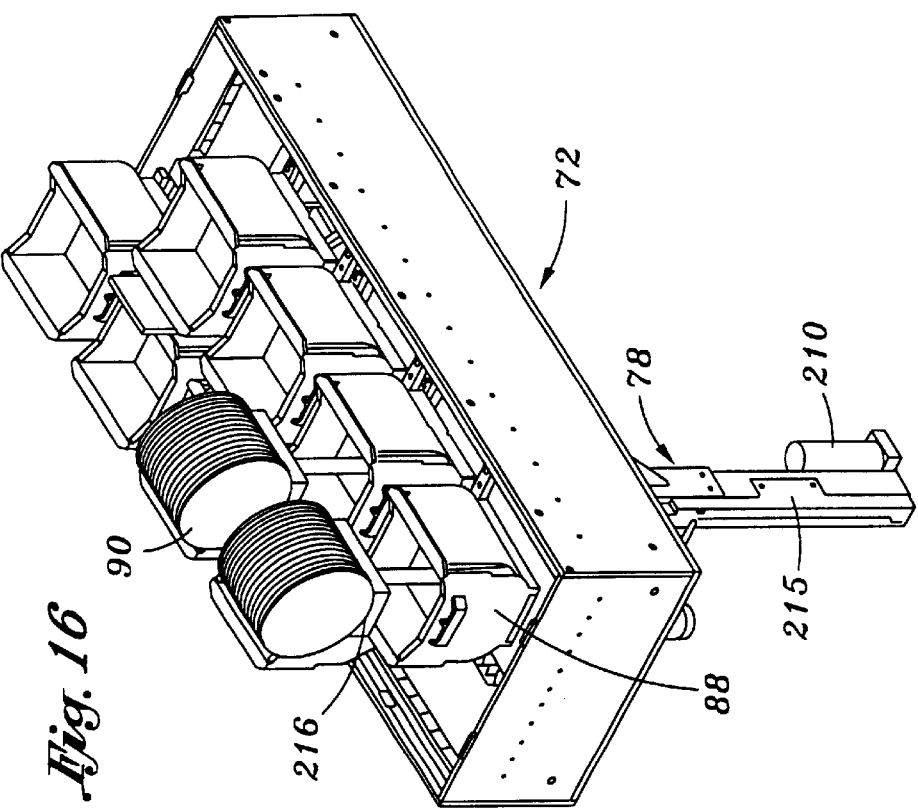
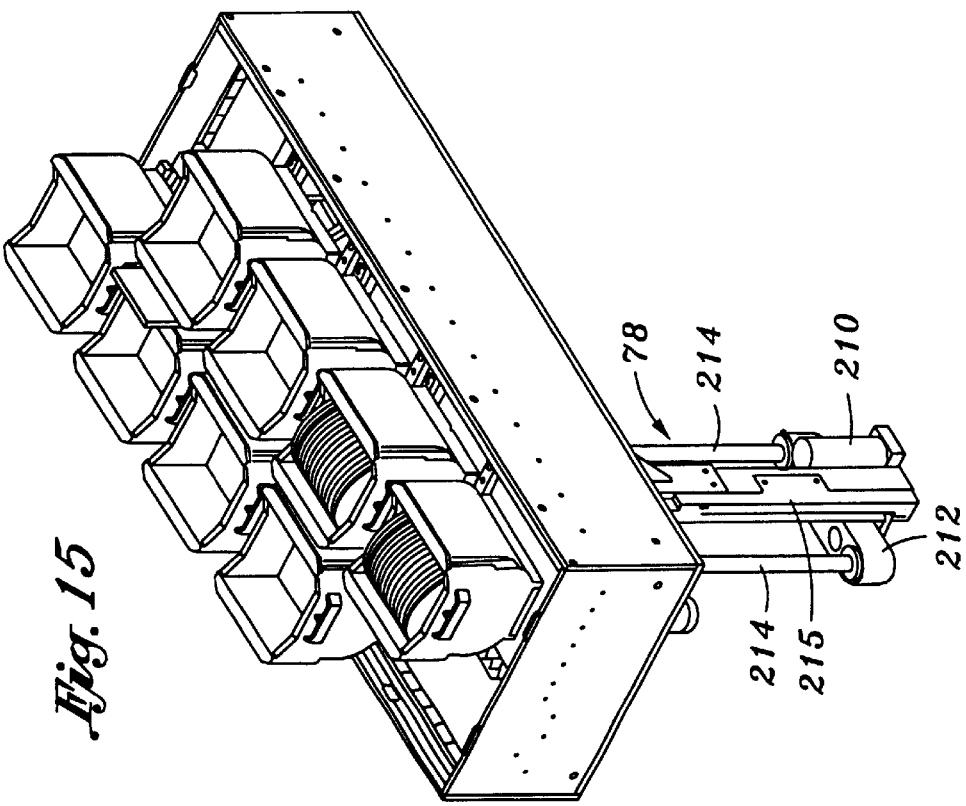

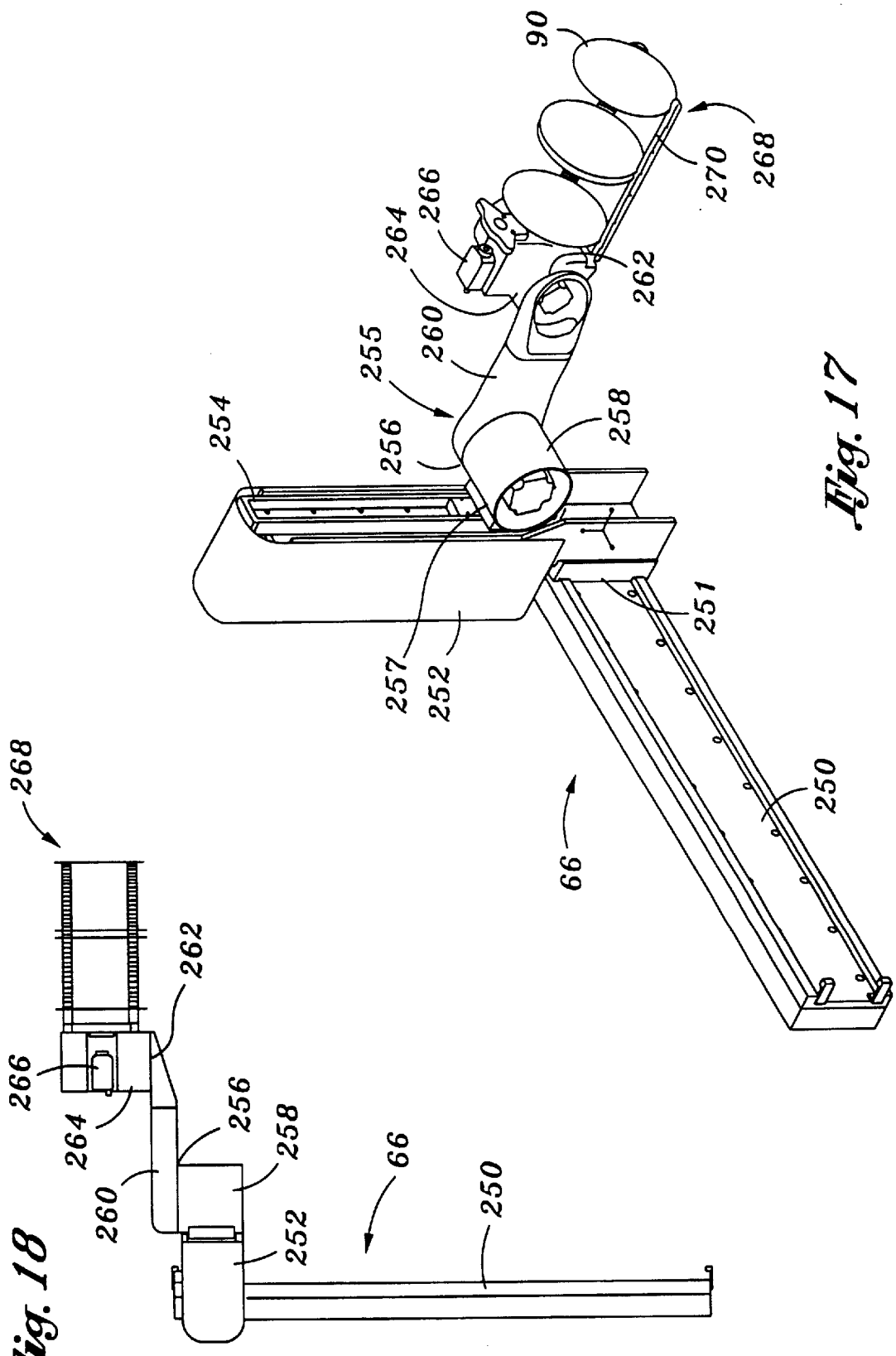

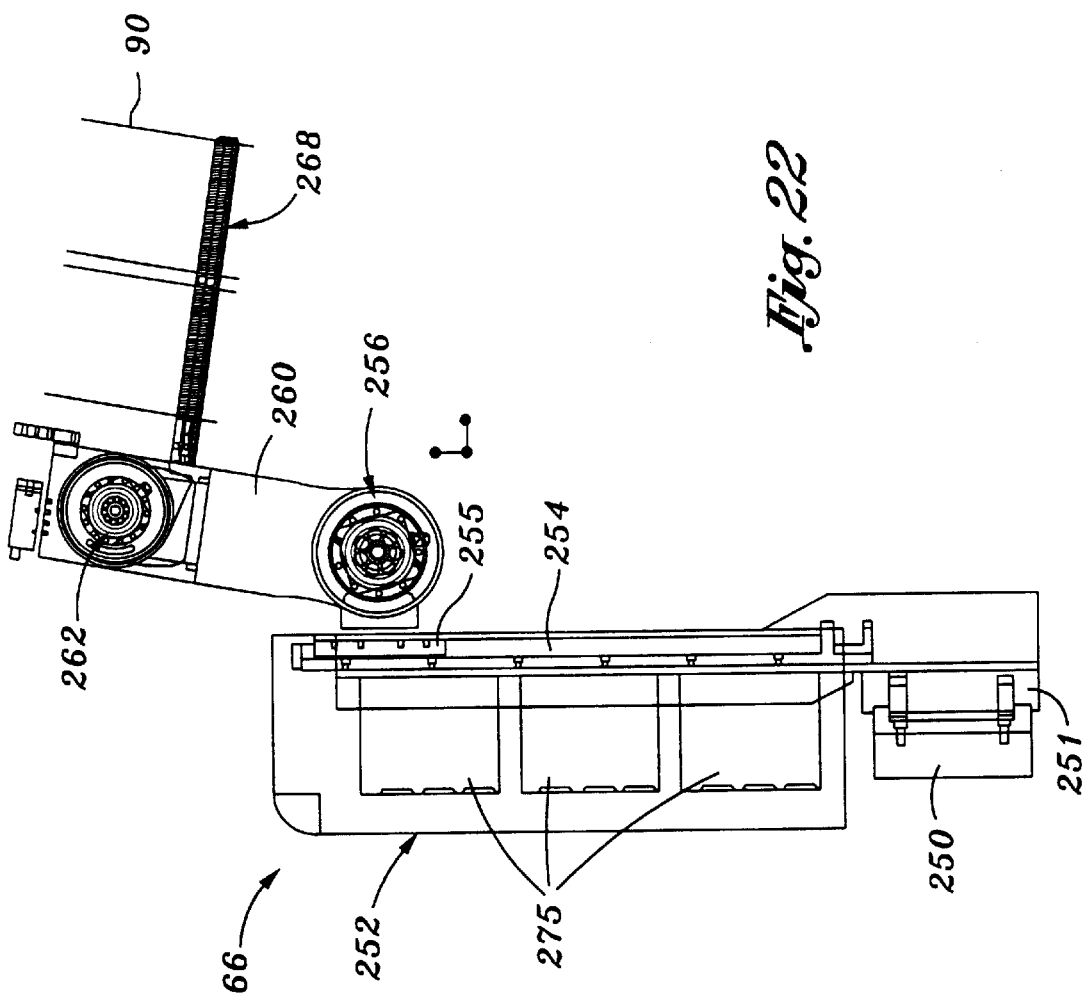

AUTOMATED SEMICONDUCTOR PROCESSING SYSTEM

This application is a Division of U.S. patent application Ser. No. 09/112,259 filed Jul. 8, 1998, now U.S. Pat. No. 6,273,110 which is a continuation-in-part of U.S. patent application Ser. No. 08/994,737, filed Dec. 19, 1997 and now U.S. Pat. No. 6,447,232, and with both applications incorporated herein by reference. This Application is also a Continuation-in-part of U.S. patent application Ser. No. 08/994,737, filed Dec. 19, 1997, now U.S. Pat. No. 6,447,232, which is a Continuation-in-part of U.S. patent application Ser. No. 08/851,480, filed May 5, 1997, and now abandoned.

The field of the invention is automated processing systems used for processing semiconductor wafers, hard disk media, semiconductor substrates, and similar articles requiring very low levels of contamination.

BACKGROUND OF THE INVENTION

Computers, televisions, telephones and other electronic products contain large numbers of essential electronic semiconductor devices. To produce electronic products, hundreds or thousands of semiconductor devices are manufactured in a very small space, using lithography techniques on semiconductor substrates, such as on silicon wafers. Due to the extremely small dimensions involved in manufacturing semiconductor devices, contaminants on the semiconductor substrate material, such as particles of dust, dirt, paint, metal, etc. lead to defects in the end products.

To exclude contaminants, semiconductor substrates and similar articles are processed within clean rooms. Clean rooms are enclosed areas or rooms within a semiconductor manufacturing facility, designed to keep out contaminants. All air provided to a clean room is typically highly filtered to prevent airborne contaminants from entering into or circulating within the clean room. Special materials and equipment are needed to maintain contaminants within the clean room at adequately low levels. Consequently, construction and maintenance of clean rooms can be time consuming and costly. As a result, the semiconductor processing equipment installed within a clean room should preferably be compact, so that large numbers of semiconductor wafers can be processed within a smaller space, thereby reducing space requirements and costs. Accordingly, there is a need for smaller semiconductor processing equipment, to reduce clean room space requirements.

Existing automated semiconductor processing systems use robots to carry the semiconductor materials. These robots are designed to avoid creating particles which could contaminate the semiconductors. However, even with careful design, material selection, and robot operation, particles may still be created by these robots, via their moving parts. Accordingly, there is a need for improved techniques for processing articles with very low levels of contamination to maintain the level of defects at acceptable levels.

SUMMARY OF THE INVENTION

In a first aspect of the invention, an automated processing system has an indexer bay or space and a process bay or space within an enclosure. The indexer bay is oriented perpendicularly to the process bay, to form a compact design requiring less floor space in a clean room.

In a second separate aspect of the invention, an indexer is provided in the indexer bay. The indexer preferably holds pallets for supporting articles contained within cassettes. Pallet movers in the indexer move the pallets and cassettes in sequence from an indexer loading position, through a plurality of intermediate storage positions, to an indexer unload position. The indexer allows the automated processing system to run continuously, by moving and storing cassettes.

In a third separate aspect of the invention, a process robot within an automated processing system has a robot arm vertically moveable along a lift rail. The robot arm has a forearm segment extending between an elbow joint and a wrist joint. A wafer holder on the robot arm is laterally offset from the elbow and wrist joints. The robot arm is compact yet has an extended range of travel. The processing system therefore requires less space.

In a fourth and separate aspect of the invention, a moveable buffer shelf is positioned over the indexer, to increase productivity and versatility of the system.

In a fifth and separate aspect of the invention, a novel process module door is provided to better close and seal a process module chamber.

In a sixth aspect of the invention, two or more of the features described above are combined to provide an improved automated processing system.

It is an object of the invention to provide an automated processing system, better designed to keep articles free of contaminants. It is a further object of the invention to provide an automated processing system that is versatile, yet compact, to reduce clean room space requirements.

Other objects, features and advantages will appear hereinafter.

BRIEF DESCRIPTION OF THE DRAWINGS

In the drawings, wherein the same reference number denotes the same element throughout the several views:

FIG. 9 is a perspective view thereof with additional components removed for clarity of illustration;

FIG. 10 is yet another perspective view thereof showing additional details;

FIG. 11 is a leftside view of the indexer shown in FIGS. 1–3;

FIG. 12 is a plan view thereof, with the pallets on the indexer removed, for clarity of illustration;

FIG. 15 is a perspective view of the elevator shown in FIG. 5, in the lowered position;

FIG. 16 is a perspective view thereof showing the elevator in the raised position;

FIG. 17 is a front perspective view of the process robot shown in FIGS. 2 and 5;

FIG. 18 is a plan view thereof;

FIG. 22 is a side elevation view, in part section, of the process robot;

DETAILED DESCRIPTION OF THE DRAWINGS

Overview

Figure 1:
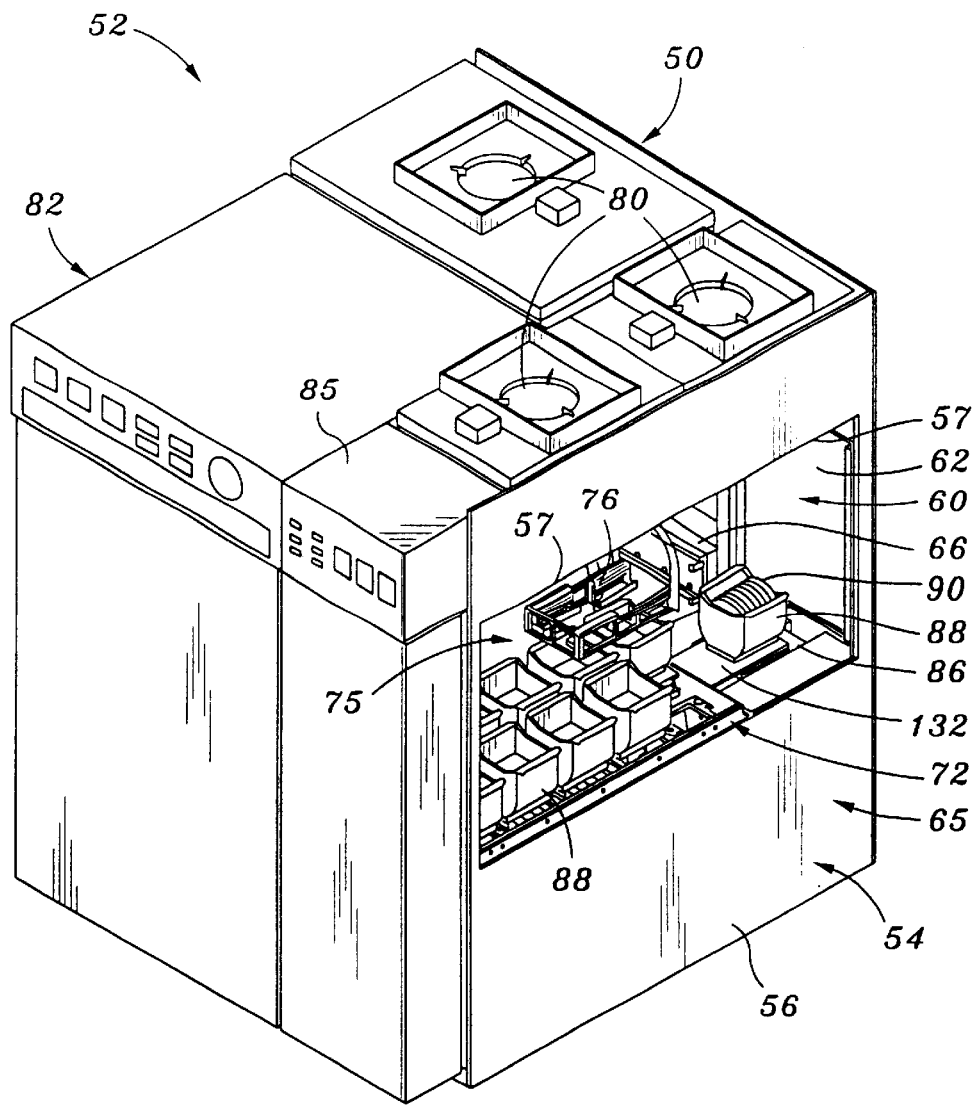
FIG. 1 is a top, rear and left side perspective view of the present automated semiconductor processing system.

Turning now in detail to the drawings, as shown in FIGS. 1–5, an automated processing system 50 is installed within a clean room 52. The system 50 has a clean air enclosure or housing 54 having a left side wall 56 with a fixed transparent window 57 to allow viewing of operations within the enclosure 54. Similarly, the enclosure 54 has a front wall 58, as shown in FIG. 52, having a fixed transparent window 59.

Figure 2:
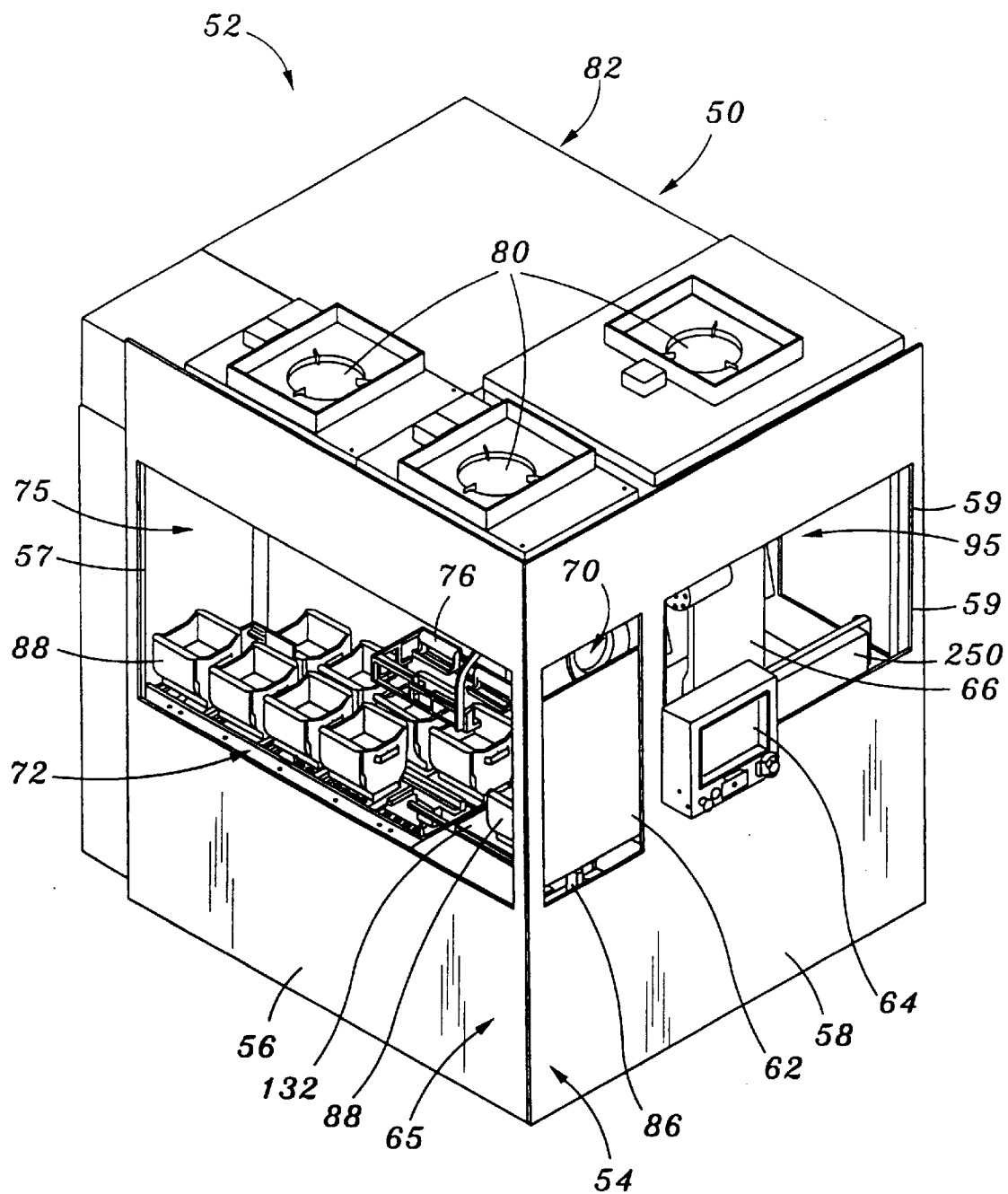
FIGS. 2 and 3 are front, top, and left side perspective views thereof.

A loading/unloading opening 60 in the front wall 58 is closed off during operation of the system 50 by a transparent loading window or panel 62, as illustrated in FIG. 2. Referring to FIGS. 1–5, down draft fans or blowers 80 are provided on top of the enclosure 54, to continuously move clean air room downwardly through the enclosure. A utilities compartment 82 provides space for power supplies, reagent tanks, pumps, and other components well known for processing.

A user interface 64, on the front wall 58 provides information and inputs control instructions from the system operator. The user interface is linked to a computer/controller 85, in the utilities compartment 82, or at a remote location. The computer/controller 85 is linked to the various motors and sensors described below, as well as to a facility control computer, to control operation of the system 50.

Figure 3:
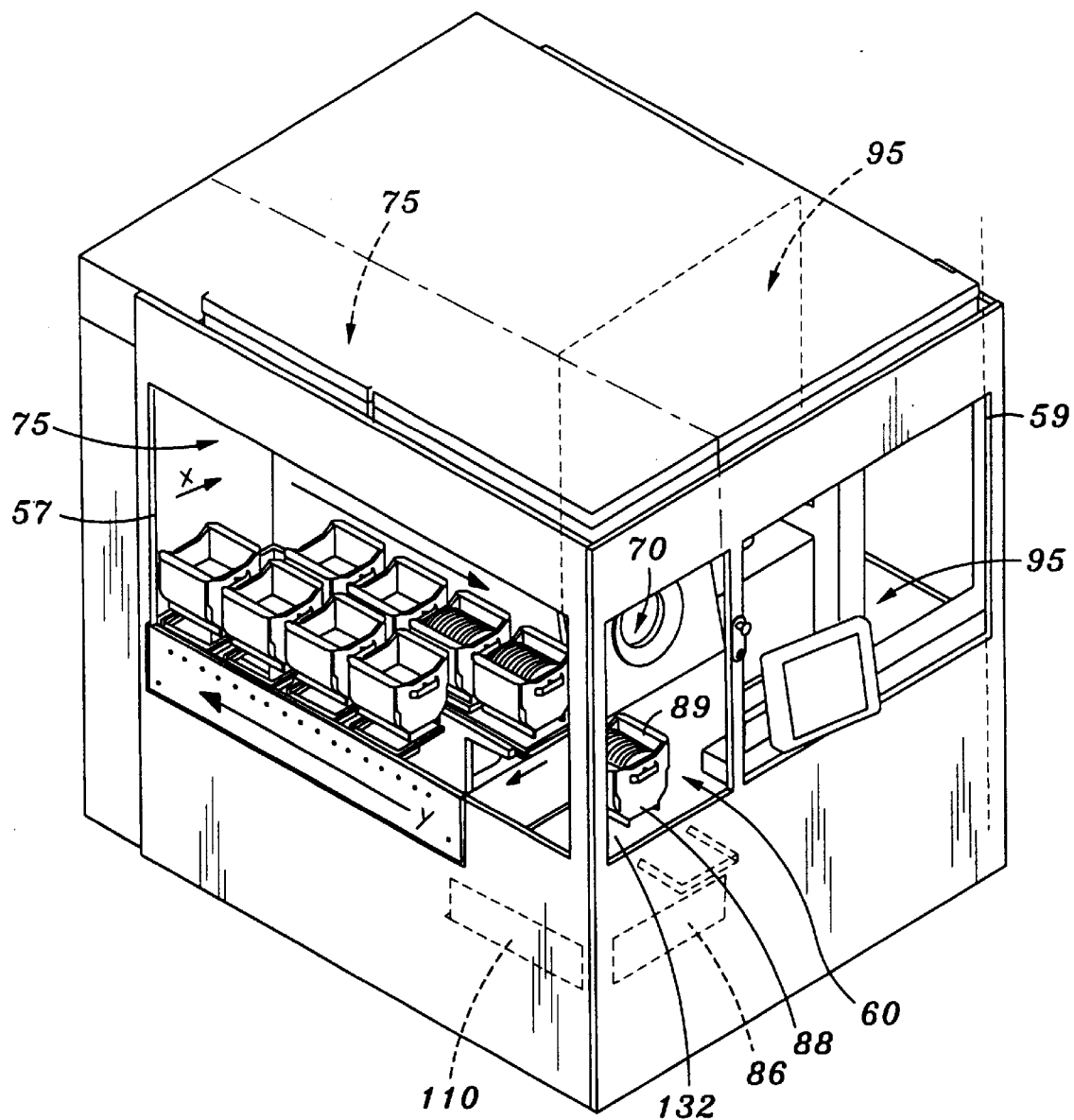

Referring to FIGS. 1–4, and especially to FIG. 3, the system 50 includes an indexer bay or space 75 extending rearwardly along the left side wall 56. A process bay or space 94 extends along the front wall 58, perpendicularly to the indexer bay 75. The indexer bay or space 75, and a process bay or space 95 are continuous with each other, and are designated and illustrated schematically in FIG. 3, only for purposes of description. Referring to FIGS. 1–5, the loading/unloading window 60 opens through the front wall 58 of the enclosure 54 into the indexer bay 75. An I/O robot 86 in the indexer bay 75 is located largely below the opening 60.

An indexer 72 is provided in the indexer bay 75, generally in alignment with the opening 60. An input plate 132 on the indexer 72 extends over the I/O robot 86 toward the window 60. The indexer 72 preferably holds up to eight cassettes 88 containing articles e.g., silicon wafers 90. The cassettes 88 rest on pallets 136 on the indexer 72. The pallets 136 and the I/O plate 132 are vertically positioned at about the same elevation as the bottom of the opening 60. A moving buffer shelf 76 is supported above the cassettes 88 on the indexer 72 via a vertical buffer plate 130 extending up from a center beam in the indexer 72.

Figure 4:
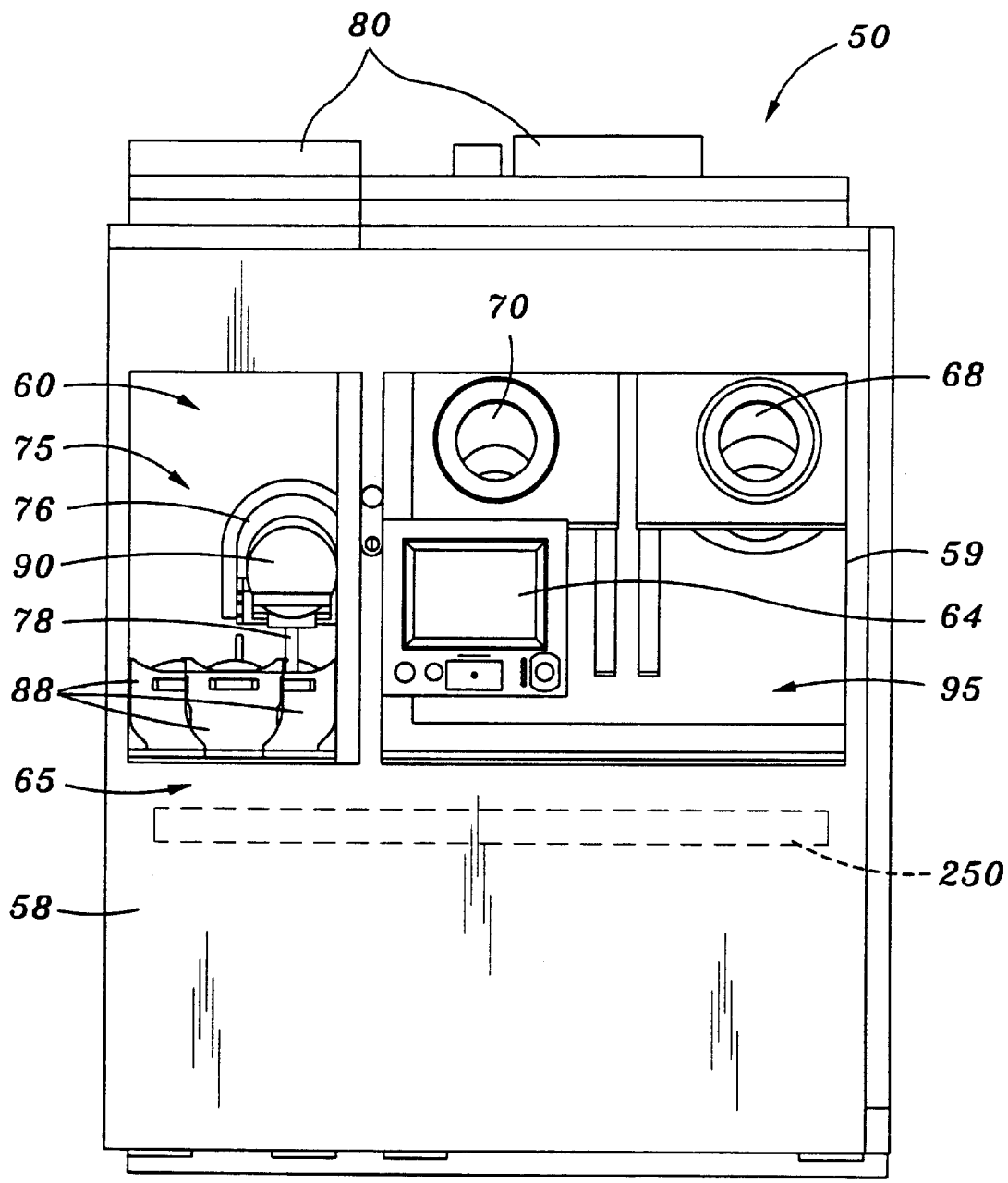
FIG. 4 is a front elevation view thereof.

Referring to FIGS. 2, 3 and 4, the process bay 95 includes two or more process chambers. In the embodiment shown, the process chambers are a chemical process chamber 68, and a spin/rinser dryer 70. A process robot 66 moves through the process bay 95 to the indexer 72, to carry wafers 90 to or from the chambers 68 or 70.

Figure 5:
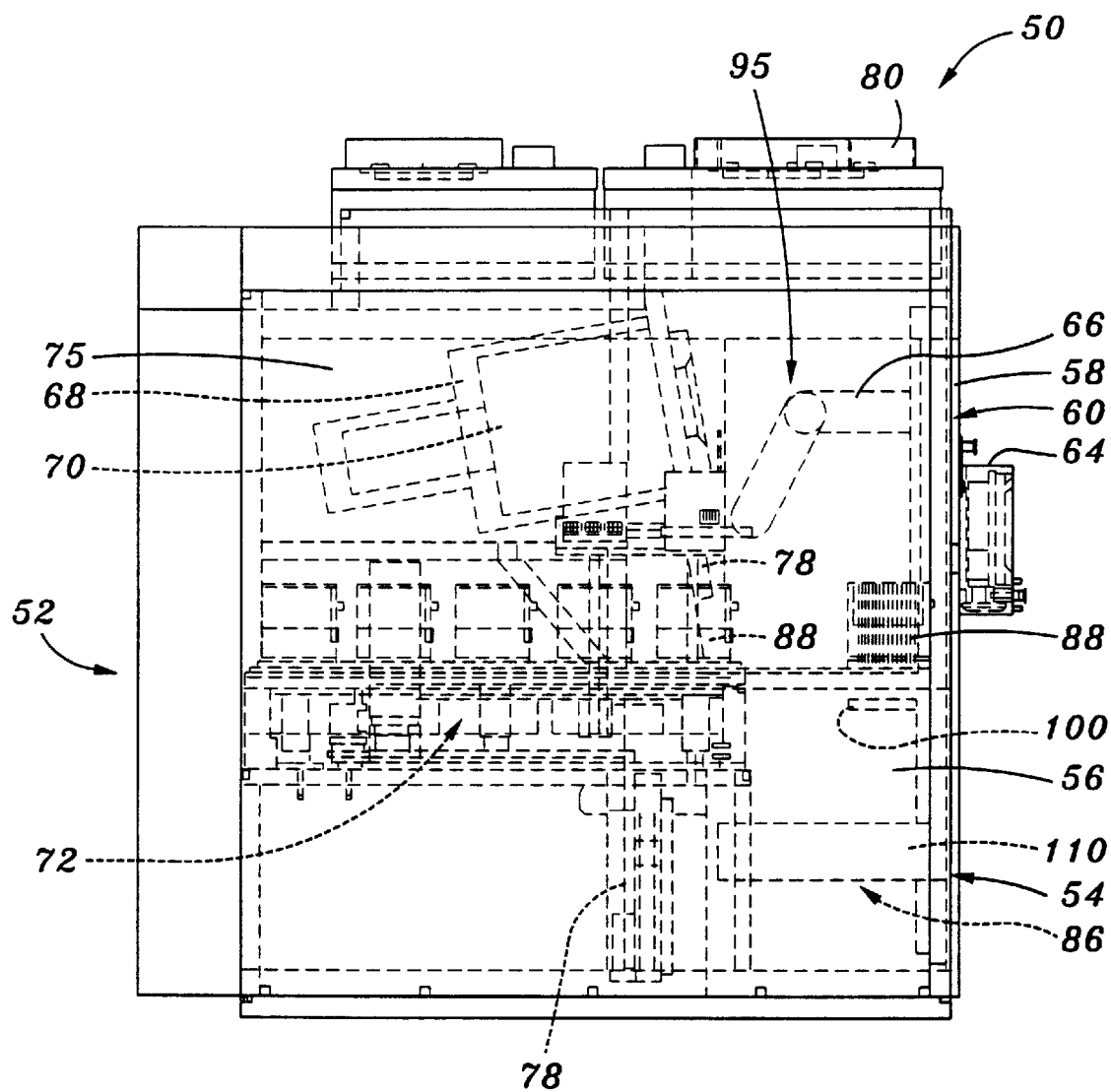
FIG. 5 is a left side view thereof.

Referring to FIGS. 3 and 5, and momentarily to FIGS. 15 and 16, an elevator 78 under the indexer 72 lifts the wafers 90 out of the cassettes 88 (2 cassette loads at a time) so that they can be picked up and carried by the process robot 66. As shown in FIG. 16, each cassette 88 preferably holds 25 wafers, with the eight cassette capacity of the indexer 72 holding 200 wafers. The wafers are handled in batches of 50, as the elevator 78 and process robot 66 carry the combined contents of two cassettes simultaneously.

The I/O Robot

Figure 6:
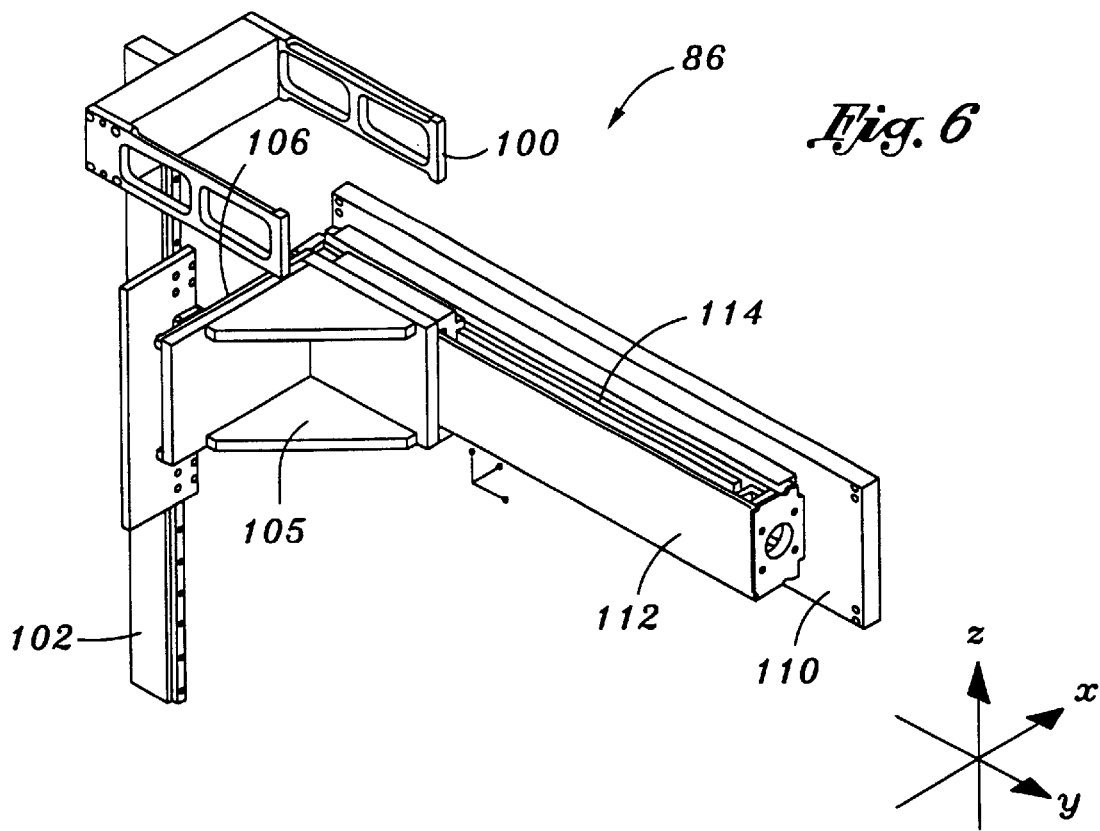
FIG. 6 is a front perspective view of the input/output robot shown in FIG. 3.
Figure 7:
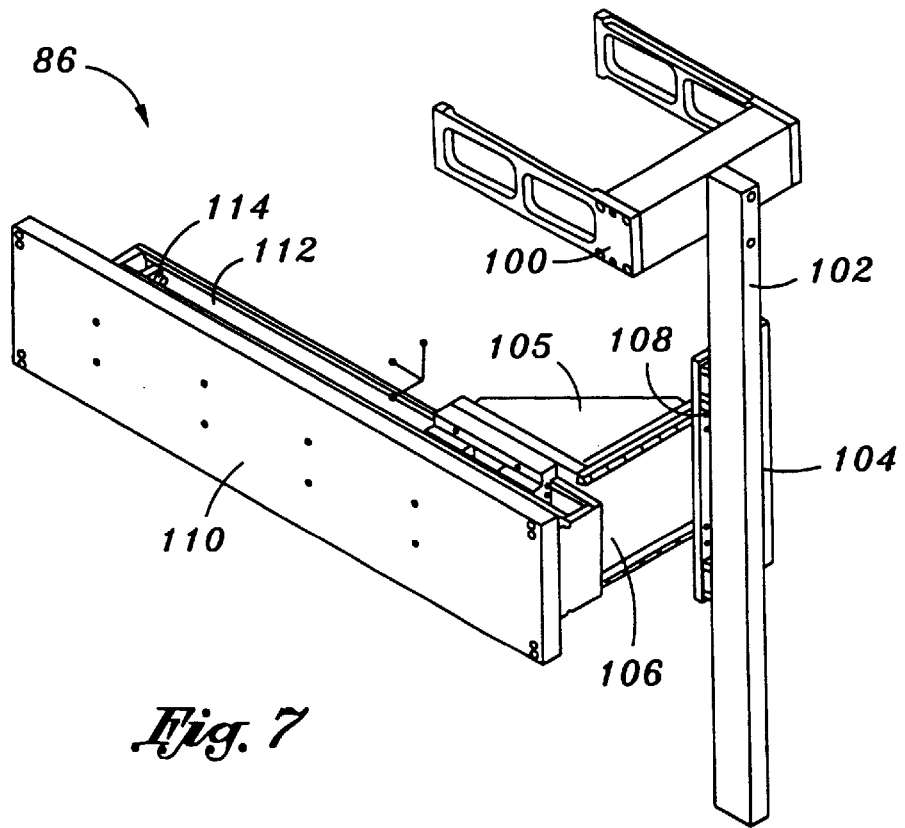
FIG. 7 is a rear perspective view thereof.

Referring to FIGS. 6 and 7, the I/O robot 86 has a mounting plate 110 attached to the left side wall 56 or adjacent enclosure structure. A Y-axis rail 112 is supported on the mounting plate 110. A linear actuator 114 on the rail 112 moves an armature 105 in the Y direction, as shown in FIGS. 3 and 6.

Referring to FIG. 7, an X-axis rail 106 on the back of the armature 105 supports a Z-axis or vertical fork rail 102. A vertical fork actuator 104 moves the rail 102 vertically on the armature 105. An x-axis actuator 108 moves the vertical rail 102, along with the vertical actuator 104, in the X or lateral direction. A cassette fork 100 near the top of the vertical rail 102 is adapted to lift a cassette 88 by engaging the cassette side flanges 89.

The Indexer

Figure 8:
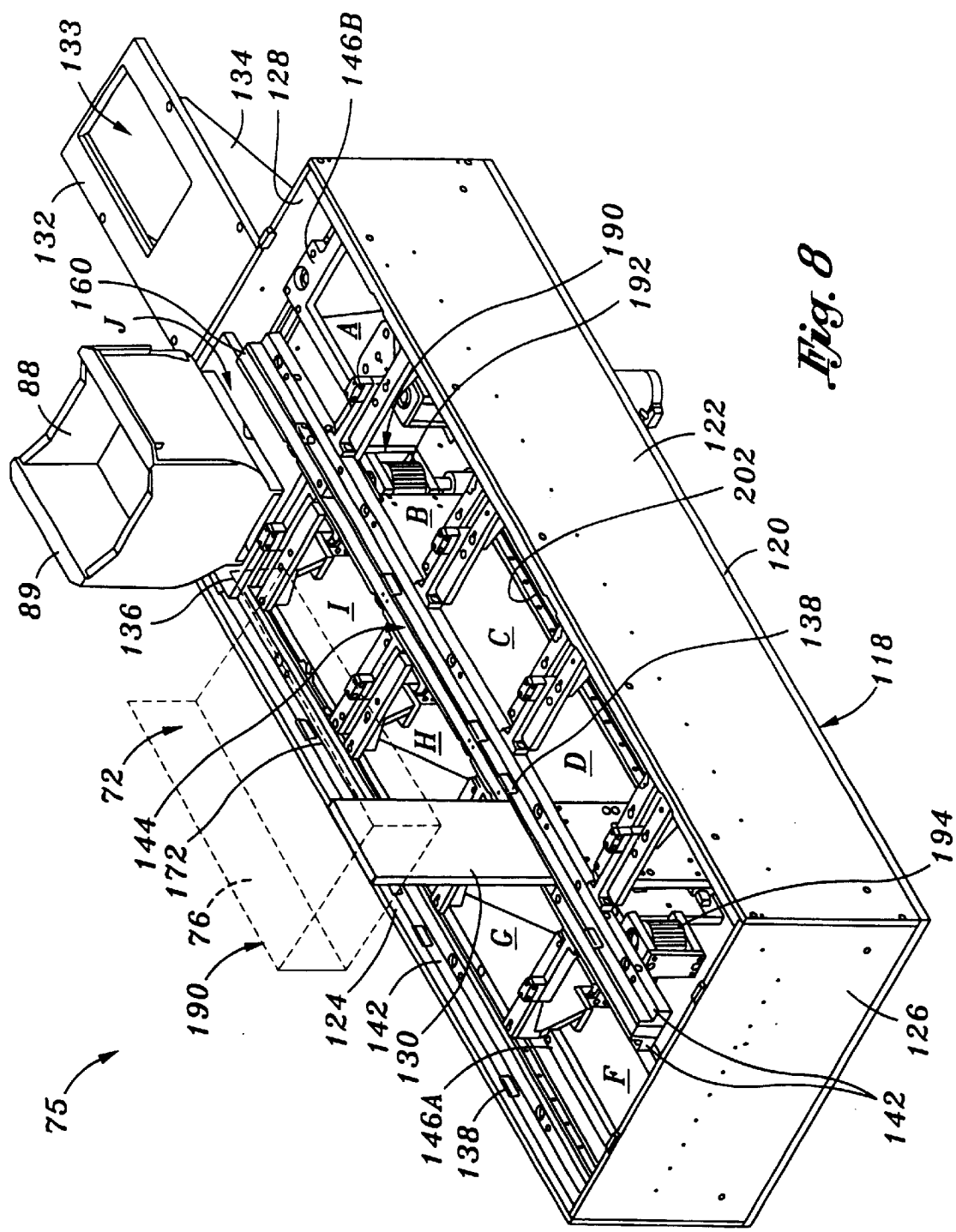
FIG. 8 is a perspective view of the indexer shown in FIGS. 1–3, with various components removed for clarity of illustration.
Figure 14:
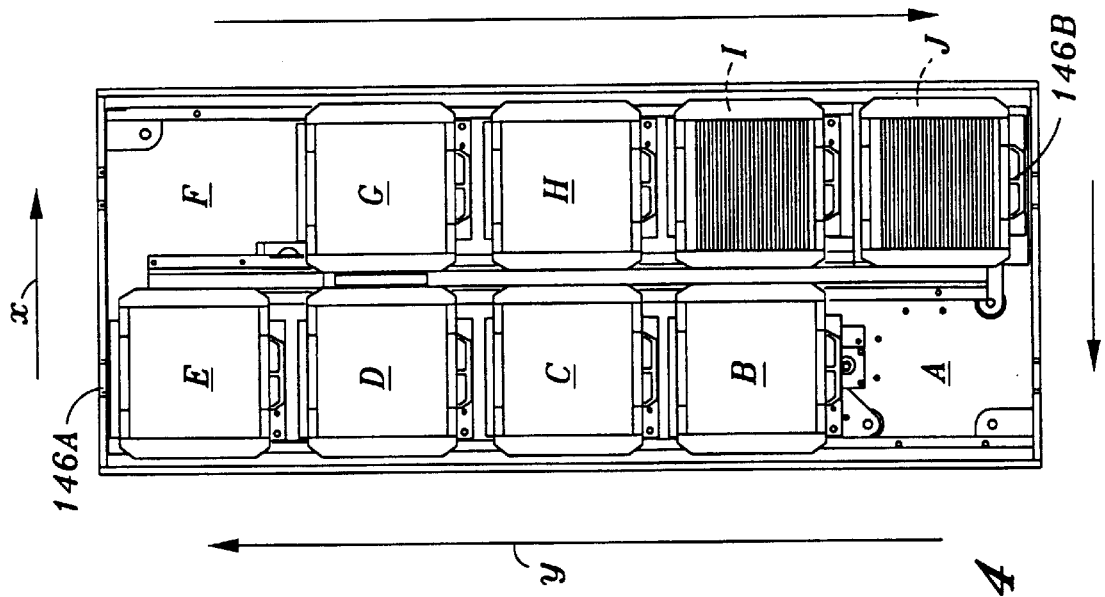
FIG. 14 is a plan view of the indexer shown in FIGS. 1–3, and illustrating sequences of movement.
Figure 13:
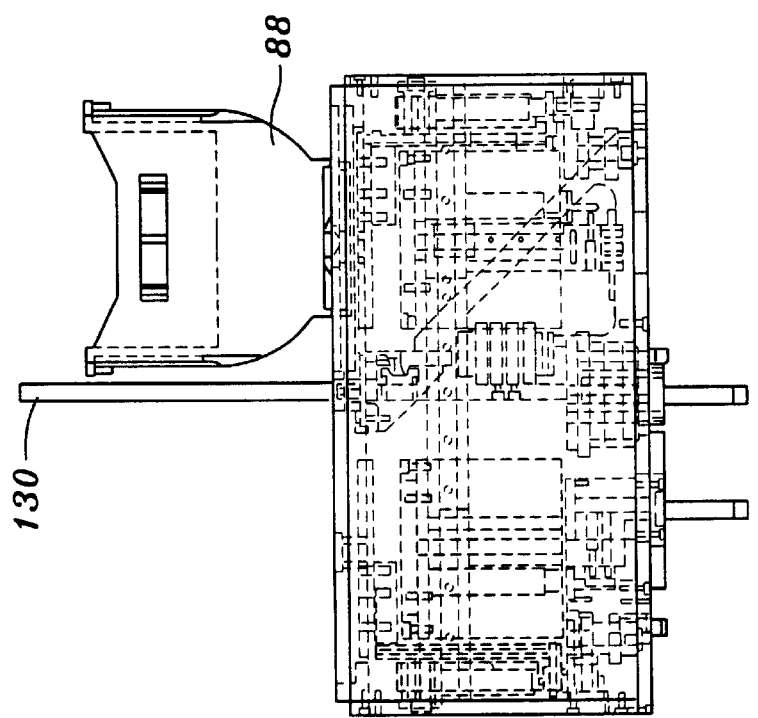
FIG. 13 is a front view of the indexer shown in FIGS. 1–3.
Figure 19:
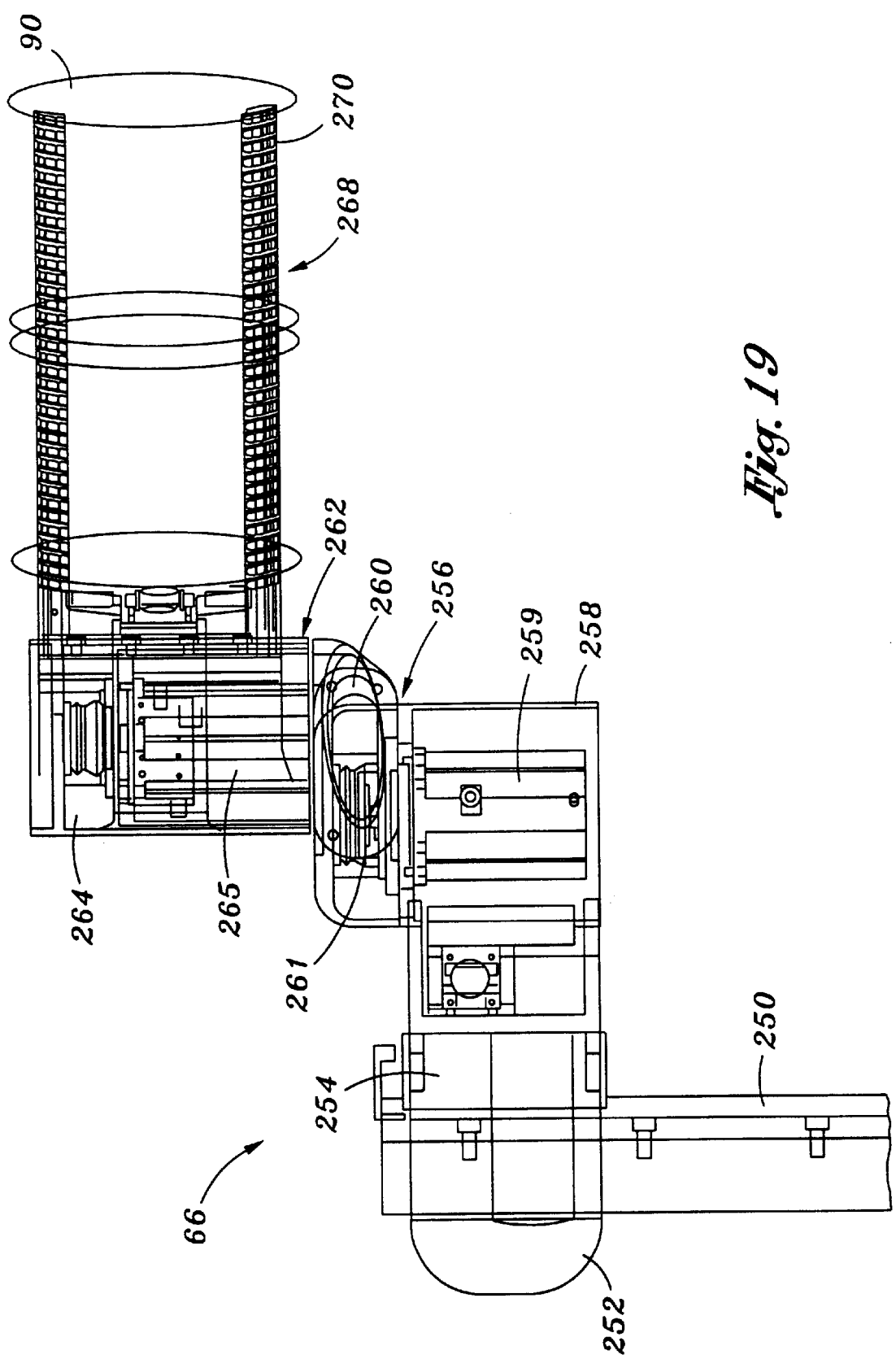
FIG. 19 is an enlarged plan view thereof.

Turning now to FIG. 8, the indexer 72 has a rectangular frame 118 including a bottom plate 120, a front plate 122, a back plate 124, and left and right-end plates 126 and 128. The I/O plate 132 is attached to the right end plate 122, and braced by gussets 134. A center beam 160 divides the indexer into an input row or side 135 and an output row 137. The vertical buffer support plate 130 is positioned and moves back and forth within a centrally located buffer plate slot 144 in the center beam 160. Two pairs of opposing pallet rails 142 extend substantially from the left end plate 126, to the right end plate 128, and provide resting or supporting surfaces for the pallets 136 at the pallet deck or surface 139. Referring momentarily to FIG. 14, the indexer 72 includes 10 pallet storage or holding positions: A, B, C, D, E, F, G, H, I, and J. The indexer 72 has eight pallets 136, so that two positions, at diagonally opposite corners, are always vacant. Turning to FIG. 12, cutouts 162 in the bottom plate 120 of the indexer 72, at positions C and H, allow air to flow downwardly through the indexer 72. Elevator clearance holes 164 through the bottom plate 120, at positions I and J, provide clearance for the elevator 78.

Referring still to FIGS. 8–14, the indexer 72 includes a X-axis or lateral shift system or assembly generally designated 140, and a longitudinal or a Y-axis shift system or assembly, generally designated 170. These shift systems move the pallets 136 carrying the cassettes 88 around on the indexer 72, as shown in FIG. 14.

As best shown in FIG. 9, the lateral shift system 140 includes a lateral guide block 150, fixed to the indexer frame 118. A lateral shift end fork 146A is supported on the lateral guide block 150, and is driven by a lateral drive motor 154 to step or sequence between positions E and F, as shown in FIG. 14. An end fork air cylinder 152 raises and lowers the end fork 146A between fixed up and down positions which are fixed by mechanical stops. FIGS. 9 and 10 show components of the lateral shift system 140 at the left or inside end of the indexer 72. Similar or duplicate components (the lateral guide block 150; an end fork 146B and a lateral air cylinder 152) are mounted at the right end as well. A lateral shift system linking belt 156 extends around the perimeter of the indexer frame 118, supported by idlers, and is attached to the diagonally opposite end forks 146A and 146B. When the lateral drive motor 154 is energized, end fork 146A moves from position F to position E, while end fork 146B simultaneously moves from position A to Position J, and vice versa.

Referring still to FIGS. 8–14, the longitudinal or Y-axis shift assembly 170 of the indexer 72 includes longitudinal guide rails 172 extending parallel to the front and back plates 122 and 124, on either side of the center rail 160. Eight side forks 180B–180J are located at positions B, C, D, E, G, H, I, and J, as best shown in FIG. 12. A side fork actuator or air cylinder 174 is attached to each of the eight side forks 180. The air cylinders 174 are longitudinally displaceable with the side forks 180, as they move back and forth on the longitudinal guide rails 172. The eight side forks 180 are joined together by a longitudinal drive belt 178. The longitudinal drive belt 178 extends in a loop around the perimeter of the indexer frame 118, supported on idlers. The longitudinal drive belt 178 is positioned within the indexer frame 118 vertically above the lateral drive belt 156. A longitudinal or Y-axis drive motor 176 is engaged to the drive belt 178, such that with actuation of the motor 176, all eight side forks 180 move simultaneously. Referring to FIG. 12, when the motor drives side forks 180B–180E in the input row 135 in direction I, the side forks 180G–180J on the opposite side of the center beam 160B, in the output row 137, move in direction O.

Referring to FIGS. 8–11, the indexer 72 also includes a buffer shelf shift system or assembly, generally designated 190. The buffer shift system 190 shifts the vertical buffer plate 130, which supports the buffer shelf 76 from the front position shown in FIG. 9 to the rear position shown in FIG. 8. The buffer shelf 76, shown in phantom in FIG. 8 is omitted from the other figures, for clarity of illustration.

Referring primarily to FIG. 10, the buffer shift system 190 includes a buffer drive motor 198 linked to a buffer drive belt 200 through a flex coupling 196, and a buffer capstan 192. The buffer drive belt 200 extends around the capstan 192 and a buffer belt idler 194, positioned at opposite ends of the buffer plate slot 144. The vertical buffer plate 130 is secured to the buffer drive belt 200. The bottom end of the vertical buffer plate 130 is slidably attached to a buffer plate guide rail 202 underneath the buffer plate slot 144.

The indexer 72 has three sets of sensors 138 at each location A–J. The three sensors at each location may be separate individual sensors, or a single combination sensor. The sensors, at each position, sense whether a pallet is present; whether a cassette is present on a pallet; and whether wafers are present in a cassette. The sensors are linked to a controller or computer and provide status information for each location in the indexer 72. Preferably, optical sensors are used.

Turning now to FIGS. 15 and 16, the elevator 78 has a motor 210 linked to an armature 212 through a lead screw or other rotation to linear drive. Wafer platforms 216 are supported on lift columns 214. Actuation of the motor 210 lifts the armature 212 up along a elevator rail 215, to vertically move the wafers 90 into and out of the cassettes 88. With the wafers 90 lifted out of the cassettes 88 as shown in FIG. 16, they can be picked up by the process robot 66.

The Process Robot

Figure 23:
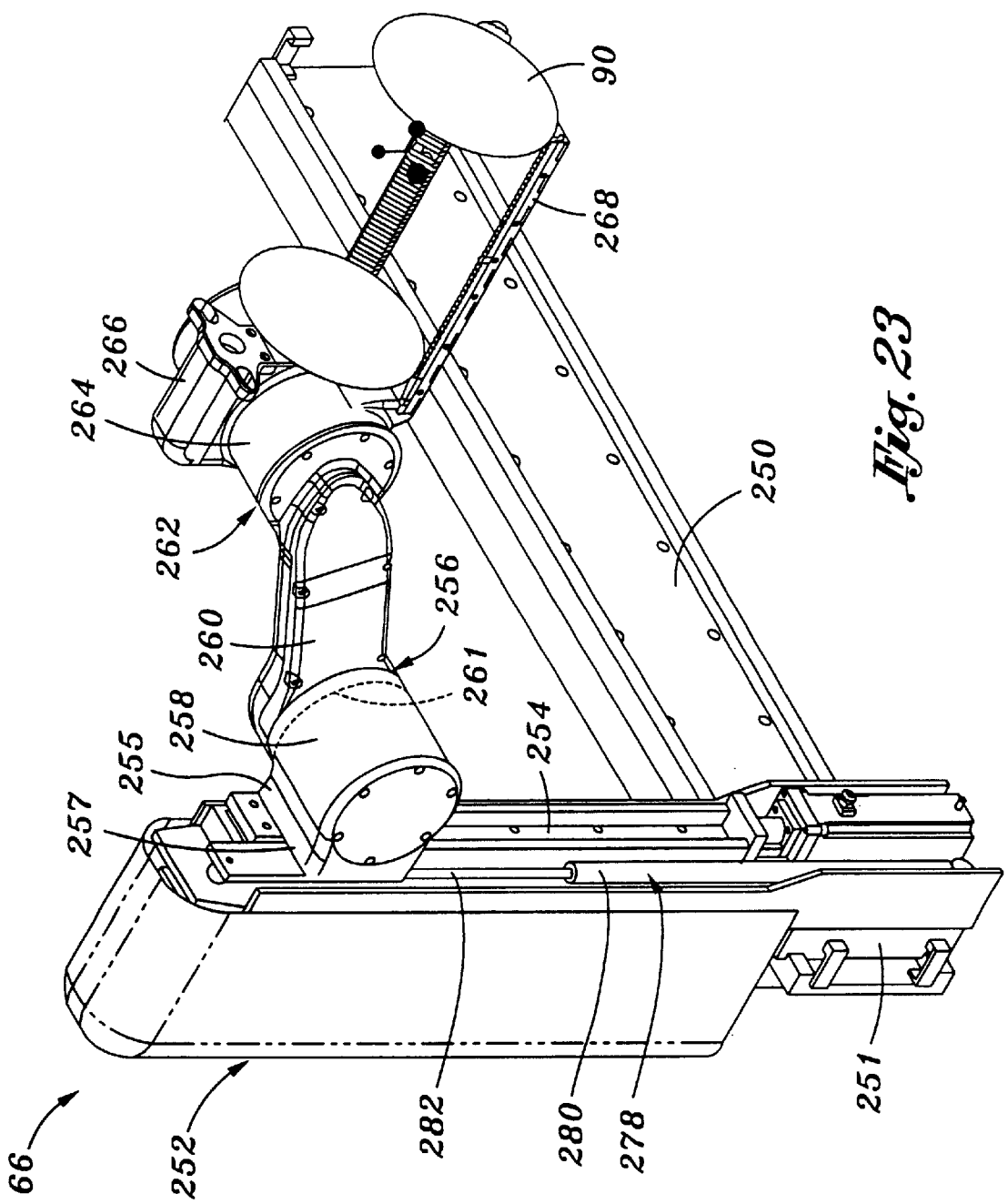
FIG. 23 is a front perspective view of the process robot.

Turning now to FIGS. 17–23, the process robot 66 includes a lateral or X-axis rail 250 extending through the process bay 95 and partially into the indexer bay 75. A lift unit 252 is moveable along the lateral rail 250, driven by a magnetic flux linear drive motor 251. A robot arm, 255, is attached to a vertical lift rail 254 on the lift unit 252. An A/C lift motor 257 moves the robot arm 255 vertically along the lift rail 254. As shown in FIG. 23, the cylinder 280 of a gas spring counter balance 278 is attached to the robot arm 255. A piston 282 extending out of the cylinder 280 is attached to the lift unit 252. The gas spring counterbalance 278 exerts a constant upward force on the robot arm 255, to reduce the lifting or braking force that the lift motor 257 must exert to move or position the robot arm 255.

Referring still to FIGS. 17–23, the robot arm 255 has an elbow drive A/C motor 259 within an elbow housing 258. The elbow housing 258 is attached to the slide of the lift rail 254, on the lift unit 252. A forearm 260 is attached to the elbow housing 258 via an elbow joint 256. The forearm 260 is mechanically coupled to the elbow drive motor 259 via a gear reduction 261.

A wrist drive A/C servo motor 265 is contained within a wrist housing 264 pivotably attached to the outer end of the forearm 260 via a wrist joint 262. A wafer holder 268 formed by opposing end effectors 270 is joined to the lower front area of the wrist housing 264. Grooves 274 in the end effectors 270 facilitate engaging, lifting and carrying the wafers 90. A remote camera head 266 positioned on top of the wrist housing 264, and linked to the computer/controller 85, views the positions of the rotor rotainers within the process chambers (as described in U.S. patent application Ser. No. 08/623,349, incorporated herein by reference). The computer/controller can then determine whether the process robot can properly insert the wafers into the process chamber. The camera head 266 is also used to verify that the rotor retainers are fully locked before processing begins within the process chamber.

Motor amplifiers 275, for driving the wrist drive motor 265, elbow drive motor 259, lift motor 257, and lateral drive motor 251, are contained in and move with the lift unit 252. Locating the motor amplifiers in the lift unit 252 reduces space requirements and cabling requirements.

The Process Module

Figure 25:
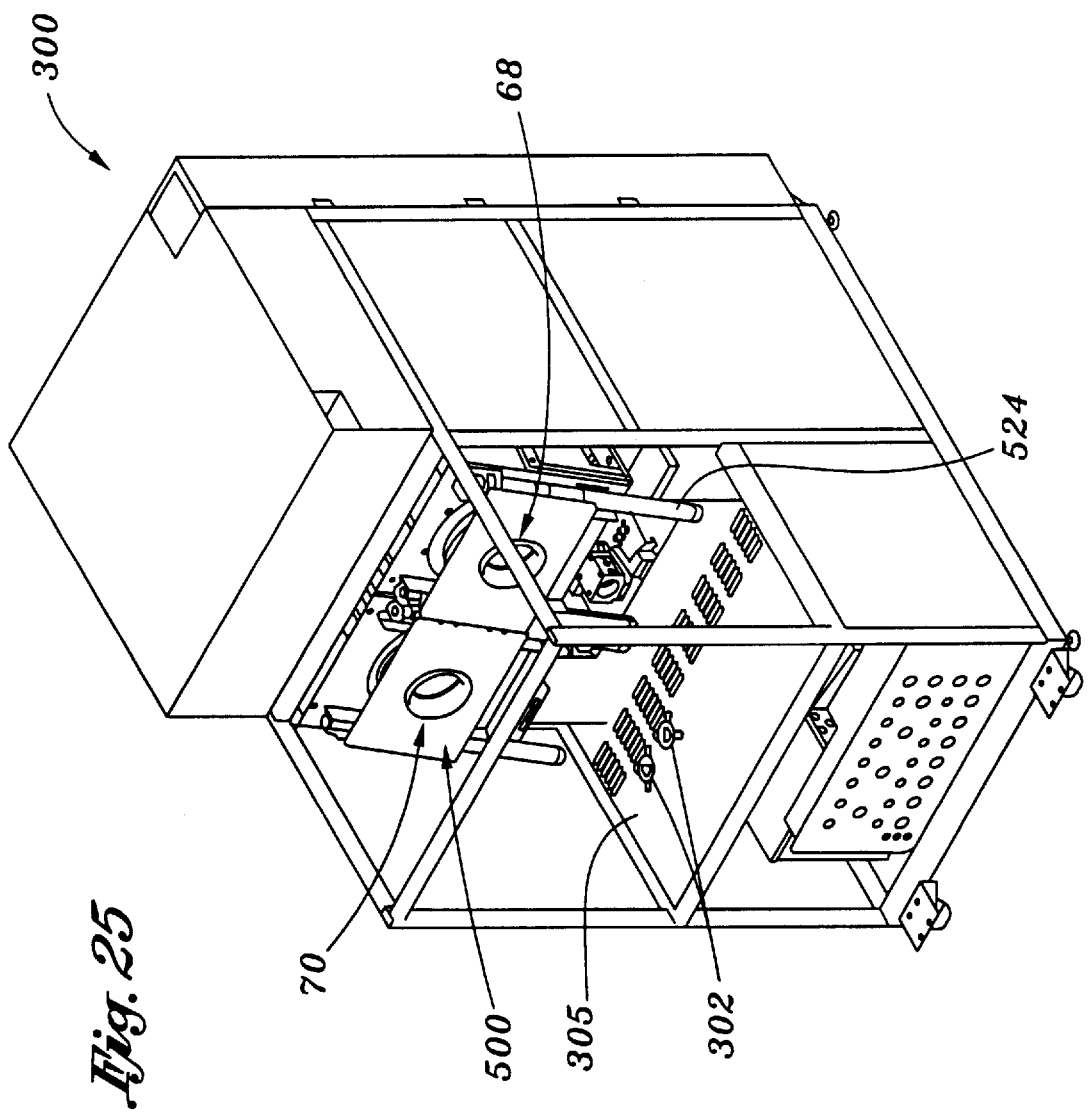
FIG. 25 is a perspective view of a process module, as shown in FIGS. 3–5.

Turning now to FIG. 25, a process module 300 in the process bay 95 includes, for example, the spin rinser dryer 70 and the chemical process chamber 68, although other modules, or additional modules may be used. End effector rinser dryers 302 are provided in the front floor 305 of the process module 300.

Referring to FIGS. 26–29, the process module 300 includes a process vessel 310 which partially encloses a process bowl 314. The process vessel 310 mates with a movable door 512 which can be moved between the closed position shown in solid lines in FIG. 26, and an open position shown in phantom outline.

Figure 26:
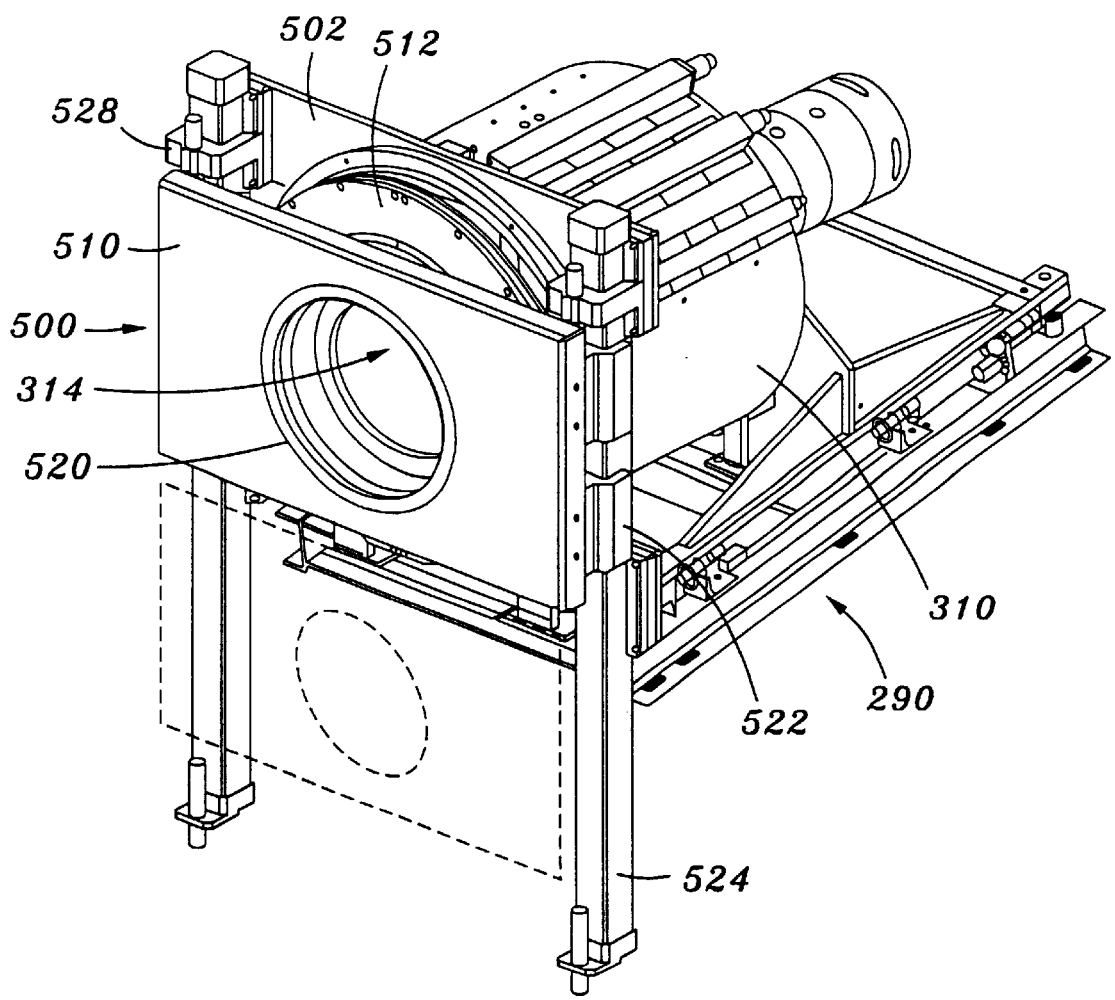
FIG. 26 is a perspective view of the process module illustrated in FIGS. 4, 5 and 25, and having a novel door actuation and sealing mechanism.
Figure 27:
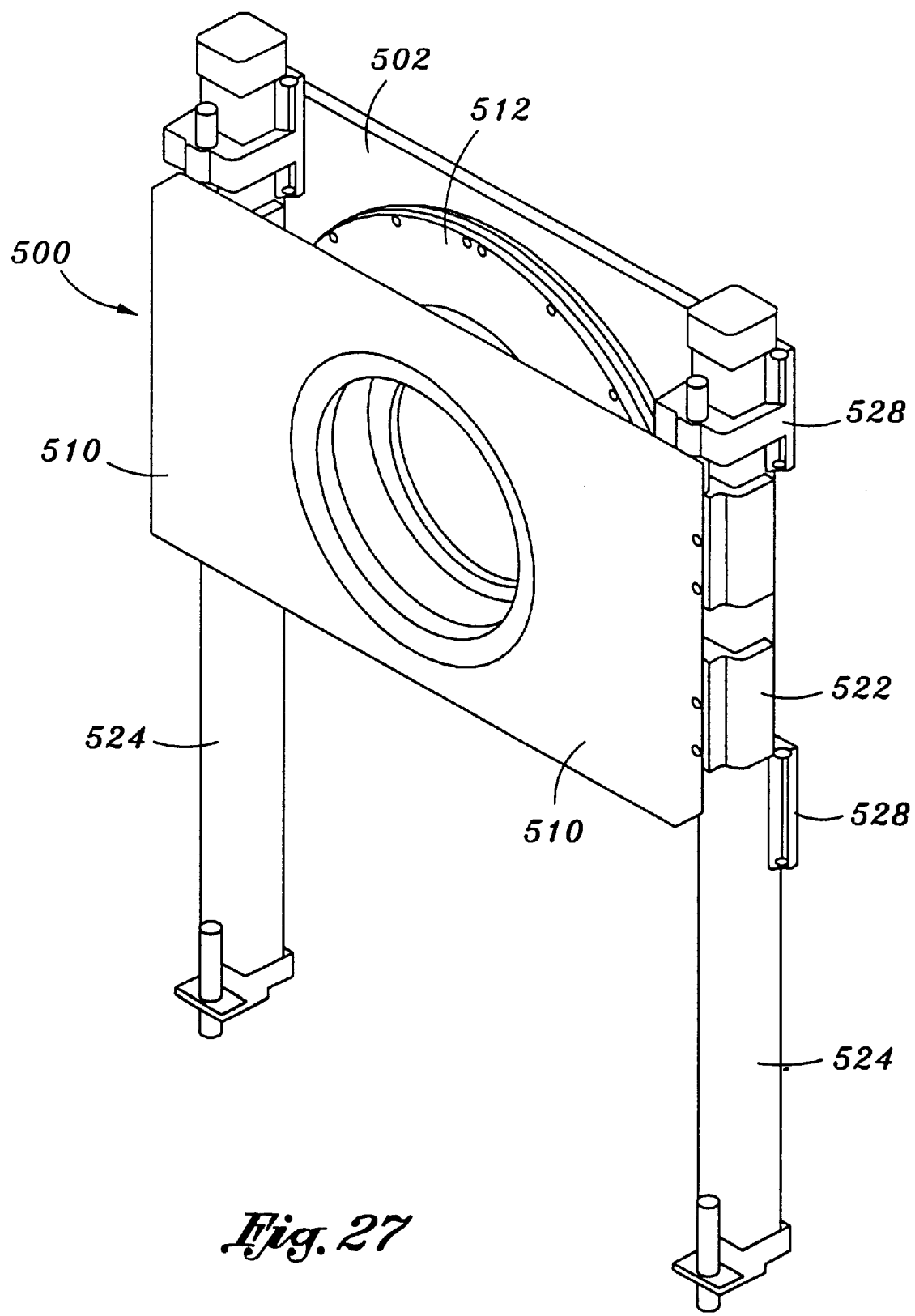
FIG. 27 is a perspective view of the process module do or actuation assembly.

Referring to FIGS. 26 and 27, the door assembly 500 is aligned in a fixed position parallel to a front wall 502 of the process vessel 310.

The door assembly 500 includes a door plate 510 supporting a door 512 and a door actuator 514 generally designated 514. The door 512 includes a stiffening plate 504 having a viewing window 508 that permits visual inspection of the processing bowl or chamber 314. The door actuator 514 includes a stationary outer cylinder 516 coupled to the door support plate 510, and an extension ring 518. The extension ring 518 is concentrically and slidably positioned inside of the outer cylinder ring 516. The door support plate 510 includes a viewing aperture 520, which aligns with the window 508, when closed, for providing visibility into the processing chamber.

Referring to FIGS. 26 and 27, the door support plate 510 is attached on each side to slideable guide brackets 522. Each guide bracket 522 is slidably mounted to a pneumatic cylinder 524. The cylinders 524 are connected to the front wall 502 of the processing vessel via mounting plates 528. The combination of the guide brackets 522, the cylinders 524, and the mounting plates 528 provides a rigid door mounting construction that needs no additional guides or support blocks. The guide brackets 522 are mounted for substantially vertical movement so that the door assembly can be moved between an open position to allow access into the bowl of the processor, and a closed position wherein the door assembly is in substantially concentric alignment with the bowl 314. In the closed position, the door can be extended and sealed against the bowl 314 of the processor.

Figure 28:
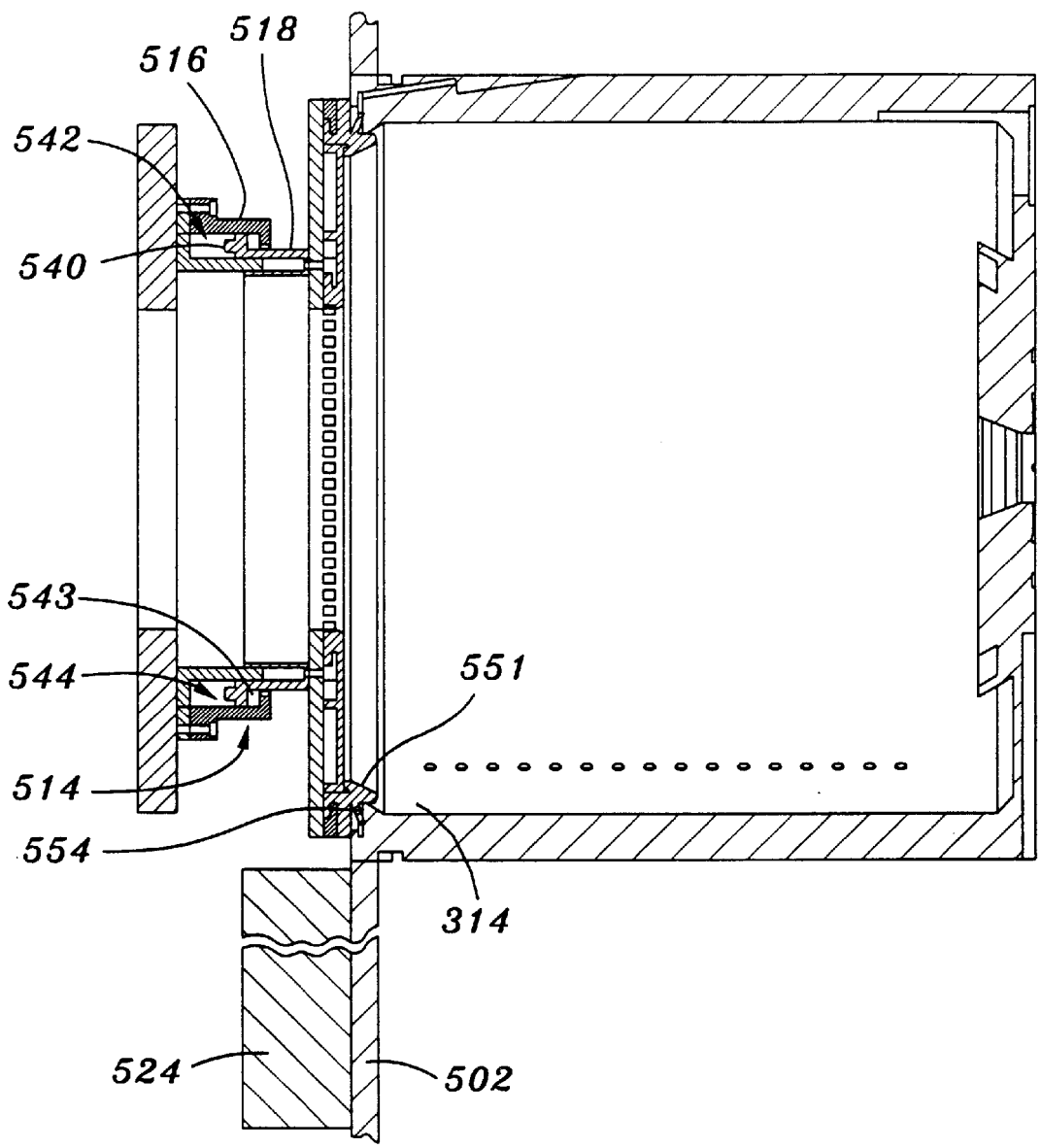
FIG. 28 is a cross-sectional side view of the process module door in an open position.
Figure 29:
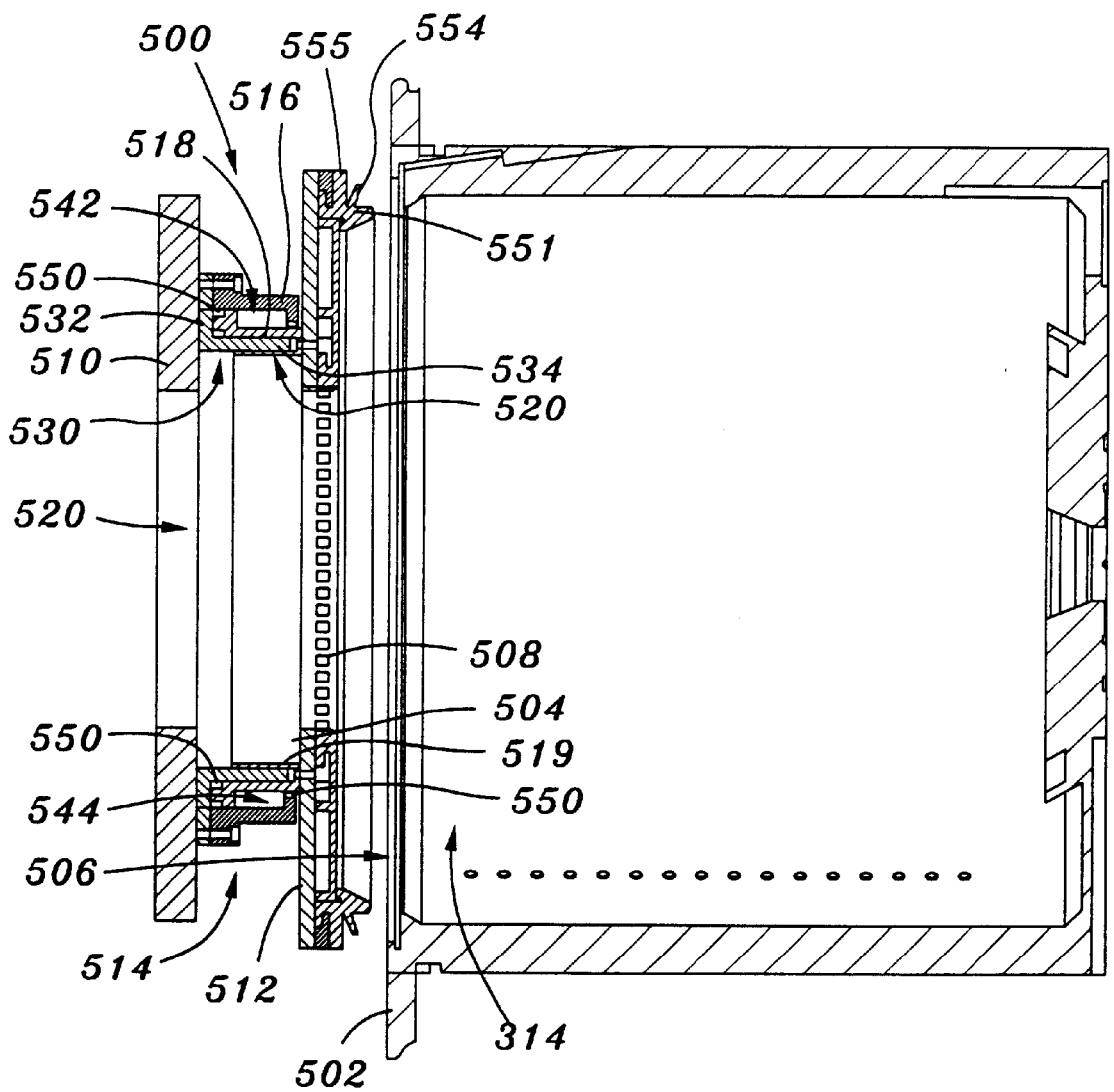
FIG. 29 is a cross-sectional side view of the process module door in a closed position.

Referring to FIGS. 28 and 29, an annular inner hub 530 has an annular flange 532 and a cylinder 534. The annular flange 532 is attached to the door support plate 510. A plurality of fasteners secure the outer cylinder ring 516 and the annular flange 532 concentrically to the mounting plate 510.

The extension ring 518 is concentrically positioned between the hub 530 and the outer cylinder ring 516, and includes a U-shaped portion 519 that defines an annular guide receptacle 520. The cylinder 534 fits within the annular guide receptacle 520. The extension ring 518 also includes an annular end face 540, as shown in FIG. 28. The extension ring 518 is displaceable with an annular chamber 542 defined by the cylinder 534 and the other cylinder ring 516, to seal and unseal the bowl 314.

The extension ring 518 bifurcates the chamber 542 into two operative compartments: a retraction chamber 543 and an extension chamber 544. Each chamber is adapted to hold pneumatic or hydraulic fluid and act as pneumatic or hydraulic cylinder. Multiple annular seals 550 are positioned on or against the extension ring 518 to seal the chambers 543 and 544.

Separate fluid supply conduits are preferably provided to the retraction chamber 543 and the extension chamber 544 to increase or decrease fluid pressure within the respective chambers and effectuate movement of the extension ring 518. As shown in FIG. 28, when hydraulic fluid is supplied to the extension chamber 544, the extension ring 518 moves away from the door support plate 510. Movement of the extension ring 518 into the extended position shown in FIG. 28 moves the door 512 into sealing engagement with the access opening 506 of the processor bowl, thereby sealing the process module 300.

An annular door seal 551 is mounted on the periphery of the door 512. The door seal includes a lip 552 and a tongue 554. When the door is in the closed position shown in FIG. 28, the lip 552 of the door seal lies in a plane that is within the front wall of the processor, and the tongue presses in sealing engagement against the outside rim of the process bowl 314 thereby making a seal between the door 512 and the process bowl 314. The door seal also preferably includes a flange 555 which acts as a stop for the door seal.

The combination of the extension ring 518 and the door seal 550 provides a highly reliable and effective door closing and sealing mechanism. Piston-like movement of the ring 518 allows it to move the door 512 straight outwardly from the support plate without bowing or bending, and without the need for peripheral adjustments to ensure smooth movement. By seating against the outside rim of the process bowl, the tongue provides an effective fluid tight seal and automatically compensates for any misalignment between the door and the processor.

The inner hub 530 and the outer cylinder ring 516, are rigidly attached to the door plate 510. The door plate, in turn, is fixed relative to the process bowl 514, via the connection of the door plate 510, to the cylinders 524, to the front wall 502. Consequently, as the extension ring 518 moves outwardly away from the door plate 510, it can press tightly against and seal the bowl 514.

Operation

In use, the operator of the system 50 initiates a loading sequence by entering commands via the user interface 64. The window panel 62 drops down, thereby opening the loading window 60. The operator places a cassette 88 filled with wafers or articles 90 onto the I/O plate 132. The cassette 88 may be initially placed on the I/O plate 132 by a human operator or by another robot. The cutout 133 in the I/O plate positions the cassette 88, so that it may be lifted by the I/O robot, and also allows air to flow downwardly over the wafers 90 in the cassette 88.

The fork 100 of the I/O robot 86 is initially in the same X-Y position as the I/O plate 132. The vertical fork motor or actuator 14 raises the fork 100, until the fork has engaged the side flanges 89 of the cassette 88. The I/O robot 86 then lifts the cassette 88 vertically off of the I/O plate 132, shifts laterally (in the X direction) towards the left side wall 56, via actuation of the lateral motor 108. This movement aligns the now lifted cassette with the input row of the indexer. The I/O robot 86 then moves the lifted cassette longitudinally (in the Y-direction) toward the indexer, until the cassette is aligned above a pallet in position A, via the Y-axis motor 114. The I/O robot then sets the cassette 88 down on the pallet 136 at position A on the indexer 72. If there is no pallet at position A, the indexer 72 must first be sequenced, as described below, to bring a pallet into position A. The I/O robot then returns the fork 100 to its initial position.

With a first cassette 88 resting on a pallet 136 at position A, which is the cassette loading position, the longitudinal shift system 170 moves the side forks 180B–J (in the direction of arrow O in FIG. 12) until the side fork 180B is underneath the pallet 136 and cassette 88 in position A. The end forks 146A and 146B have down or at-rest positions below the down or at-rest positions of the side forks 180B–J, so that the side forks 180B, 180E, 180G, and 180J can move into the end positions A, E, F and J, without interfering with the end forks 146A and 146B. As all of the side forks 180B–J are attached to the longitudinal drive belt 178, they all necessarily move together in the Y direction.

With the side fork 180B underneath the first cassette 88 in position A, the eight side fork air actuators or cylinders 174 are extended, causing the side forks 180 to lift the pallets above them up and off of the pallet deck 139. With the pallets in the up position, the longitudinal drive motor 176 turns in the opposite direction, moving side fork 180B, now carrying the first cassette 88 on a pallet, from position A to position B. The air cylinders 174 are then retracted to lower the pallet 136 and cassette 88 down into position B. After this movement is completed, there is no pallet at position A. As all of the side fork actuators 174 are controlled to move simultaneously, all of the side forks 180B–J necessarily move together in the vertical Z-axis direction.

To continue loading or sequencing the indexer 72, the longitudinal drive motor 176 is again energized to move side fork 180B back towards position A, and thereby move side fork 180J from position J back to position I. During this movement, the side fork air cylinders 174 are down, so that there is no pallet movement. Rather, the side forks are merely repositioned below the pallets. The side forks are moved, in this step, enough to avoid interfering with the end forks, and not necessarily one complete position. With the side fork 180J now clear of position J, the lateral drive motor 154 is energized to move the end fork 146B from position A to position J, and to simultaneously move the end fork 146A from position F to position E. Once under position J, the lateral air cylinders 152 are extended, lifting end fork 146B, and the pallet at position J, and simultaneously lifting end fork 146A to lift the pallet at position E. The lateral drive motor 154 is then energized in the reverse direction (direction L in FIG. 12) and via the lateral belt 156, the end fork 146B carries the pallet from position J to position A, and simultaneously, the end fork 146A carries a pallet from position E to position F. The lateral air cylinders 152 are then retracted, to lower the pallets into positions A and F on the indexer deck 139.

With a second pallet in position A, the indexer 72 is ready to receive a second cassette 88. After a second cassette is positioned on the I/O plate 132, the I/O robot 86 repeats the indexer loading sequence of cassette movements, so that the second cassette is placed on the indexer at position A.

The foregoing sequence of steps is repeated until a cassette is loaded onto each of the eight pallets in the indexer. As the indexer has ten positions A–J, and eight pallets, two diagonally opposite corner positions, either positions A and F, or positions E and J, will, at any given time, not have a pallet.

After the first and second cassettes 88 loaded into the indexer 72 arrive at positions I and J, the elevator 78 is energized, lifting the wafer platforms 216 on the lift columns 214 up through the open bottom of the cassettes 88. The wafers 90 in the cassettes are lifted to an elevated access position, as shown in FIG. 16, where they are now ready to be picked up by the process robot 66.

The window panel 62 moves up to close off the loading window 60, to prevent an operator from inadvertently coming into contact with moving components within the enclosure 54.

Figure 21:
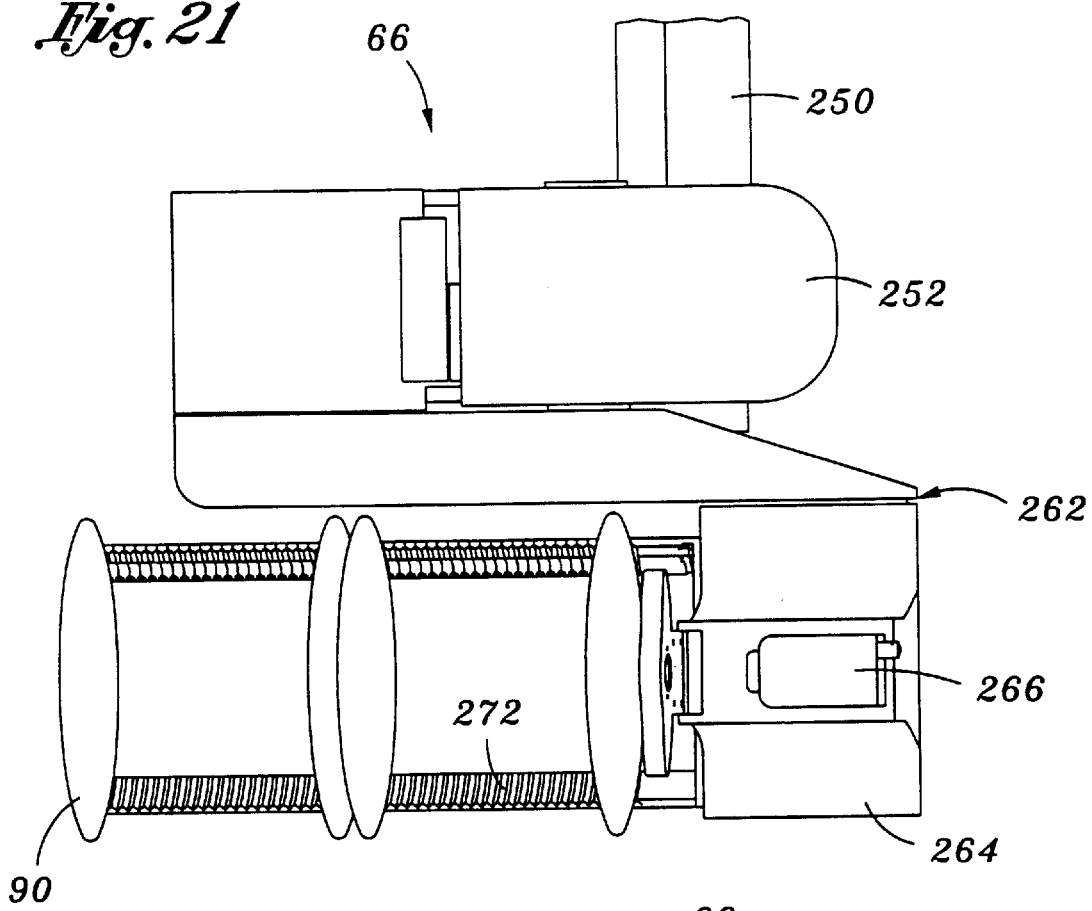
FIG. 21 is a plan view thereof.
Figure 20:
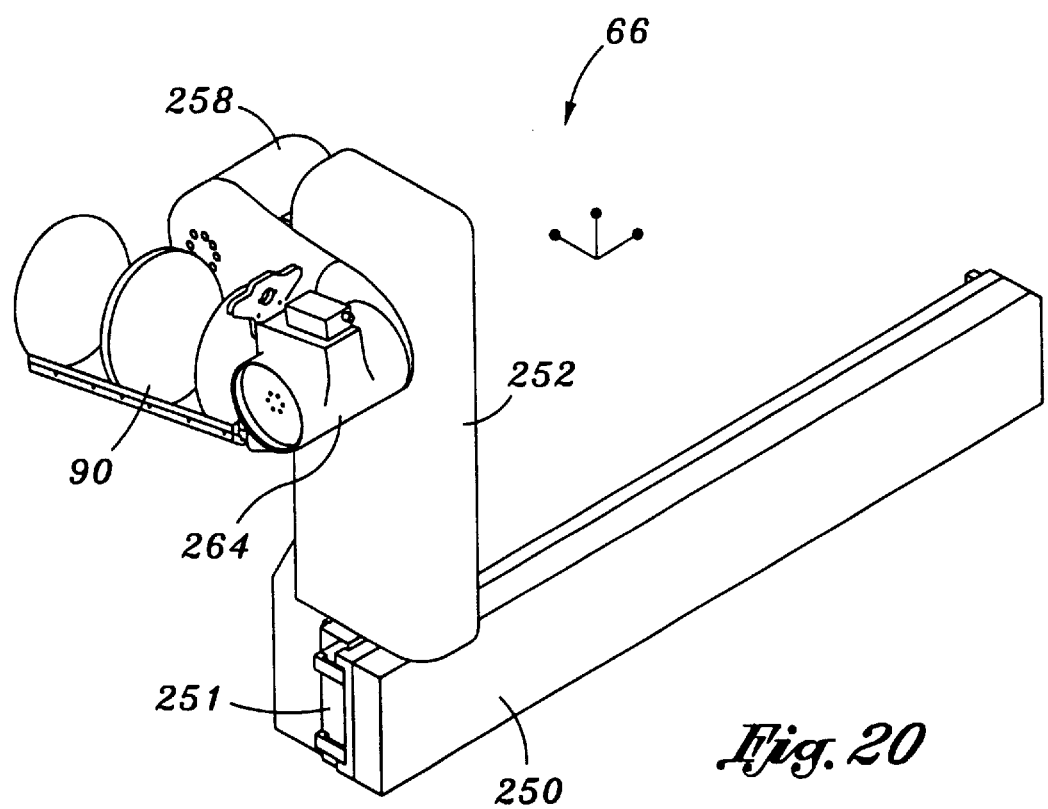
FIG. 20 is a rear perspective view of the process robot, with the arm fully withdrawn.
Figure 24:
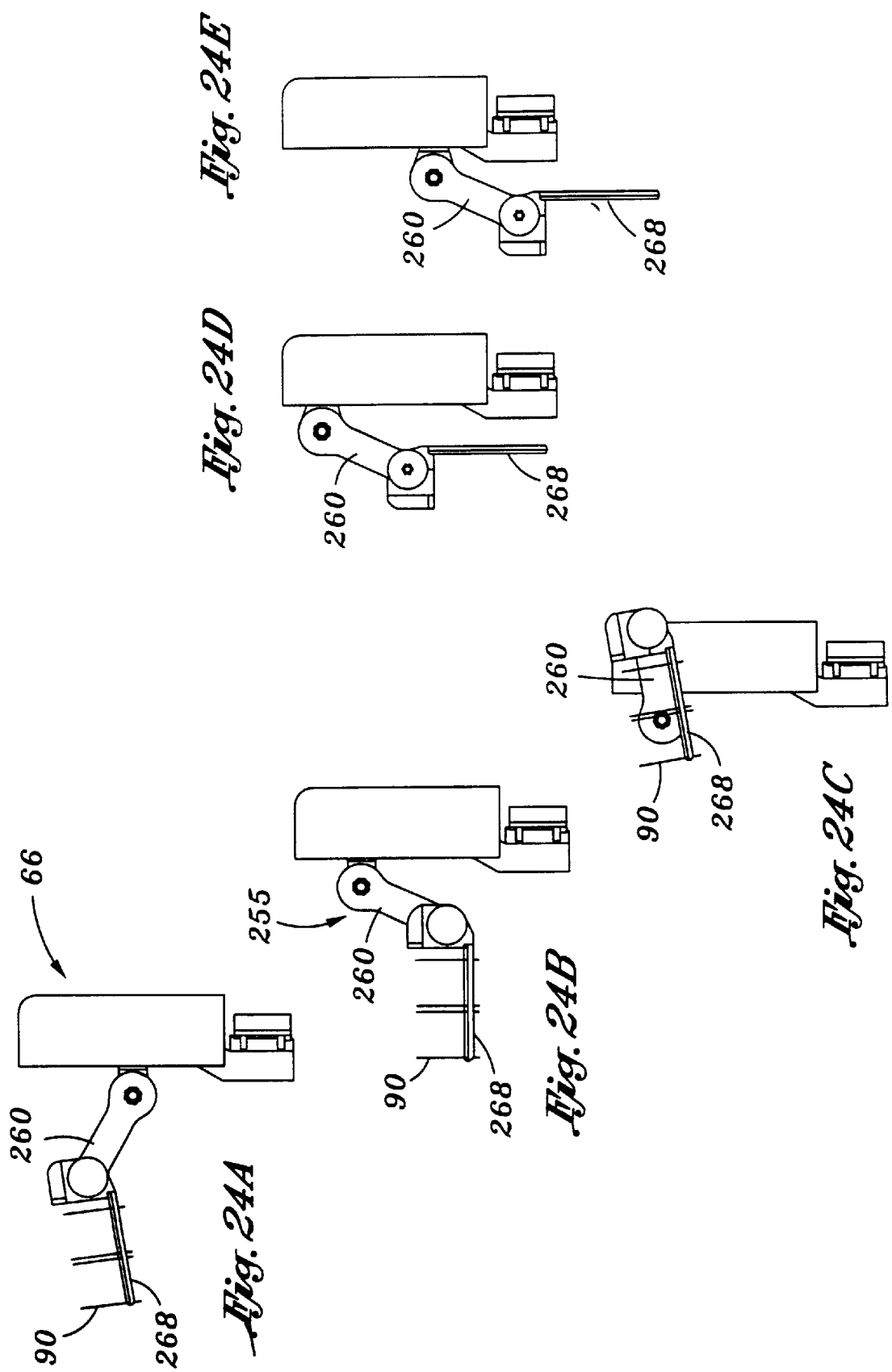
FIGS. 24A–24E are schematic illustrations showing various positions of the arm of the process robot.

Referring now to FIGS. 20, 21 and 24B, the process robot 66 moves to lift the wafers 90 off of the elevator 78. Specifically, the lateral drive flux motor 251 moves the lift unit 252 laterally until the wafer holder 268 is properly aligned with the wafers 90 on the elevator 78. With appropriate control of the lift motor 257, the elbow drive motor 258, and the wrist drive motor 265, the wafer holder 268 is moved in until the end effectors 270 are positioned and aligned on either side of the wafers 90, with the grooves 274 in the end effectors 270 each aligned to receive a wafer. As shown in FIG. 24B, this wafer engagement movement is an underhanded movement of the robot arm 255. The wafer holder 268 is moved up to lift the wafers 90 off of the elevator 78. The robot arm 255 then withdraws to the position shown in FIG. 24C. As the forearm has a 370° range of movement, and robot arm 255 is offset from the lift unit, the robot arm can be fully backed away from the indexer, with only minimal clearance space required, as shown in FIGS. 20 and 21. By appropriate control of the motors in the robot arm, the wafers are maintained in a vertical or near vertical position.

To deliver the wafers 90 to a process chamber, the lateral drive motor 251 is energized to move the lift unit 252 so that the wafers in the wafer holder 268 are brought into alignment with the selected process chamber. The robot arm 255 is raised up on the lift unit by the lift motor 257. In addition, the forearm 260 is pivoted upwardly via the elbow drive motor 259. Simultaneously, the wrist drive motor 265 is driven in an opposite direction to bring or maintain the wafer holder in an approximately 10° down incline orientation, as shown in FIG. 22. Using an overhand movement, as shown in FIG. 24A, the forearm is pivoted downwardly to extend the wafer holder carrying the wafers into the process chamber. The robot arm 255 then withdraws from the process chamber.

To clean the end effectors 270, the wrist drive motor 265 is controlled to orient the end effectors vertically, as shown in FIG. 24D. With the end effectors aligned with the end effector rinser/dryer 302, the lift motor 257 lowers the entire robot arm 255, to extend the end effectors into the end effector rinser/dryer 302. After the end effectors 270 are cleaned and dried, they are withdrawn from the end effector rinser/dryer 302 and positioned to remove wafers from either process chamber, or to pick up additional batches of wafers from the indexer for delivery to a process chamber. As the end effectors are cleaned at the process chamber rather than at another location, processing time can be reduced, because this cleaning step is accomplished without the need to move the process robot.

As is apparent from e.g., FIG. 23, the wafer holder 268 is offset to one side of the wrist joint 262 and elbow joint 256, as well as the other components of the process robot 66. No part of the process robot 66 is ever positioned directly above the wafers. As air is blown downwardly in the enclosure 54, any particles generated or released by the process robot 66 will not come into contact with the wafers. As a result, the potential for contamination of the wafers during processing is reduced.

Referring to FIGS. 24A–24E, the process robot 66 has an elbow joint 256 and a wrist joint 262, joined by a single segment or forearm 260. Consequently, in contrast to earlier known systems having shoulder, elbow and wrist joints, joined by two arm segments, the process robot 66 achieves a range of vertical reach via movement of the robot arm 255 on the lift rail 254, rather than by articulation of arm segments. This allows the process robot 66 to be very compact, while still achieving sufficient ranges of movement. Correspondingly, the entire enclosure 54 can be made more compact.

As the process robot 66 can perform both underhanded and overhanded movements, the vertical travel necessary on the lift rail 254 is limited. In addition, the ability to perform both underhanded and overhanded movements allows the forearm 260 to be relatively short, which also contributes to a compact enclosure 54.

Referring to FIGS. 1 and 16, the buffer shelf 76 moves forward (in direction O in FIG. 17) when the elevator 78 is in the down position, to receive up to 50 wafers. The buffer shelf 76 holds the wafers until the appropriate empty cassette 88 is moved into the I and J positions, so that the process robot 66 can move the disks from the buffer shelf 76 into the cassettes at positions I and J. When the buffer shelf 76 is not being loaded or unloaded with wafers, it remains in the back position (moved in direction I), so as not to interfere with operation of the elevator 78. The buffer shelf 76 temporarily holds already processed wafers, so that the process robot 66 can access and move the next batch of wafers for placement into the process chambers, before off loading already processed wafers back into the indexer. This ensures that the process chambers are constantly supplied with wafers for processing.

Thus, a novel automated processing system has been shown and described. Various changes can of course be made without departing from the sprit and scope of the invention. The invention, therefore, should not be limited, except by the following claims and their equivalents.

What is claimed is:

1. A method for processing articles, comprising the steps of:
   advancing a container in a first row of the three or more container positions;
   shifting the container from the first row to a second row of three or more container positions by lifting the container, moving the container laterally over the second row, and lowering the container to a container position in the second row;
   lifting the articles out of the container;
   carrying the articles to a process chamber;
   inserting the articles into the process chamber;
   processing the articles in the process chamber;
   removing the processed articles from the process chamber;
   carrying the processed articles back to the second row;
   returning the processed articles back into a container.

2. The method of claim 1 further comprising the step of placing the articles on a buffer shelf at an elevation vertically above all of the container positions.

3. The method of claim 2 further comprising the step of moving the buffer shelf between a first position during lifting of the articles, and a second position for receiving the processed articles, during the step of placing the processed articles on the buffer shelf.

4. The method of claim 1 wherein the articles are supported by a robot arm which is constantly positioned to one side of the articles, as the articles are moved between the second row and the processing chamber.

5. The method of claim 4 wherein the robot arm carries the articles underhanded to the processing chamber, and inserts the articles overhanded into the processing chamber.

6. The method of claim 1 further comprising the step of processing the articles by rinsing and spin drying.

7. The method of claim 1 wherein the first and second row comprise an indexer and the container is first moved in the indexer in a first direction and is then moved in the indexer in a second direction perpendicular to the first direction.

8. The method of claim 7 further including the step of lifting the container vertically in the indexer before moving the container in the second direction.

9. The method of claim 8 further including the step of moving the lifted container in the second direction, setting the container down, and then moving the container in a direction opposite to the first direction.

10. The method of claim 7 wherein the container is a first container, and further comprising the step of moving a second container in the indexer in a direction opposite to the second direction simultaneously with movement of the first container in the second direction.

11. The method of claim 1 further including the step of placing the container on a pallet and moving the pallet carrying the container through the first row of container positions.

12. The method of claim 1 wherein the container is moved sequentially through a plurality of positions in the indexer by moving the container in a first direction, and in a second direction perpendicular to the first direction.

13. The method of claim 12 further comprising the step of supporting the container on a pallet separate from the container.

14. The method of claim 1 further comprising the step of advancing the container along the second row of the indexer before lifting the articles out of the container.

15. The method of claim 1 wherein the first row is parallel to the second row.

16. A method for moving cassettes of articles during article processing, comprising the steps of:
    loading a first cassette onto a first pallet located at a first position;
    shifting the first pallet from the first position to a second position by lifting, carrying, and then lowering the first pallet;
    shifting a second pallet into the first position from a preloading position, to receive a second cassette, by moving a preloading lifting element at least partially out from under the second pallet, and then moving a second lifting element to a position under the second pallet, lifting the second pallet, carrying the second pallet over to the first position, and then lowering the second pallet down into the first position; and
    loading a second cassette onto the second pallet.

17. The method of claim 16 wherein the carrying movement of the second pallet is perpendicular to the carrying movement of the first pallet.

18. The method of claim 16 further comprising the step of sensing the presence or absence of at least one of a pallet, cassette, and articles in the cassette, at the first position.

19. The method of claim 16 wherein the pallets have an open central area.

20. A method for processing articles, comprising the steps of:
    moving a container holding articles to an indexer;
    advancing the container in a longitudinal direction in a first row of container positions the indexer;
    advancing the container in a lateral direction perpendicular to the first direction in the indexer to move the container to a second row of container positions in the indexer;
    lifting the articles out of the container by moving an elevator up through the bottom of the container to engage bottom surfaces of the articles;
    carrying the articles in the lateral direction to a process chamber;
    moving the articles in the longitudinal direction to place the articles into the process chamber;
    processing the articles in the process chamber by applying a process fluid onto the articles;
    removing the articles from the process chamber; and
    carrying the articles back to the indexer.

21. The method of claim 20 further including the steps of moving the container through a plurality of sequential positions in the indexer, with the sequential positions arranged in at least a first row and a second row.

22. The method of claim 21 wherein all of the sequential positions are vertically aligned with each other on a single level.

23. The method of claim 20 further including the steps of lifting articles off of the elevator by moving a process robot into an underhanded position, wherein a first pivot joint of the process robot is below a second pivot joint of the process robot, and moving the process robot into an over-handed position, where the first pivot joint is above the second pivot joint, for inserting the articles into the process chamber.

24. A method for processing articles, comprising the steps of:

placing a first container holding a first batch of articles onto an indexer;

placing a second container holding a second batch of articles onto an indexer;

advancing the first and second containers incrementally and sequentially through a plurality of container positions in the indexer;

lifting the first batch of articles out of the first container;

carrying the first batch of articles to a first process chamber;

inserting the first batch of articles into the first process chamber;

processing the first batch of articles in the first process chamber;

removing the first batch of articles from the first process chamber; and carrying the first batch of articles back to the indexer.

25. The method of claim 24 further including the step of placing the first batch of articles back into the first container, after they have been processed.

26. The method of claim 24 further comprising the step of carrying the second batch of articles to the first process chamber and inserting the second batch of articles into the first process chamber after inserting the first batch of articles into the first process chamber.

27. The method of claim 24 further including the step of carrying the second batch of articles to a second process chamber and inserting the second batch of articles into the second process chamber.

28. The method of claim 24 further including the step of placing additional containers onto the indexer until all but two of the positions are occupied by a container.

29. The method of claim 28 where the two unoccupied positions are diagonally opposite from each other.

30. The method of claim 24 wherein the indexer has at least six container positions arranged in first and second parallel rows further including the step of placing at least a third container and a fourth container onto the indexer, and moving at least two of the containers in the same direction at the same time.

31. The method of claim 24 further including the step of placing at least a third container and a fourth container onto the indexer, and moving at least two of the containers in opposite directions at the same time.

32. The method of claim 24 further including the step of placing at least a third container and a fourth container onto the indexer, and moving at least two of the containers in perpendicular directions at the same time.

33. The method of claim 28 further including the step of providing a pallet at each of the positions occupied by a container, and moving pallets from occupied positions, to unoccupied positions, to advance the containers through the indexer.

34. A method for processing articles, comprising the steps of:

advancing a container holding articles incrementally through three or more adjoining positions;

lifting the articles out of the container with a robot arm having an end effector for holding the articles, with the robot arm positioned to one side of the articles;

carrying the articles to a process chamber;

inserting the articles into the process chamber;

cleaning the end effector after the articles have been inserted into the process chamber, by orienting the end effector vertically, and then moving the end effector down into an end effector cleaner;

processing the articles in the process chamber;

removing the processed articles from the process chamber;

carrying the processed articles back to the indexer; and returning the processed articles back into a container.

* * * * *